US011156667B2

(12) United States Patent
Kimura

(10) Patent No.: US 11,156,667 B2
(45) Date of Patent: Oct. 26, 2021

(54) DIAGNOSTIC DEVICE FOR COIL AND DIAGNOSIS METHOD FOR COIL

(71) Applicant: AISIN AW CO., LTD., Anjo (JP)

(72) Inventor: Hideaki Kimura, Okazaki (JP)

(73) Assignee: AISIN AW CO., LTD., Anjo (JP)

( * ) Notice: Subject to any disclaimer, the term of this patent is extended or adjusted under 35 U.S.C. 154(b) by 48 days.

(21) Appl. No.: 16/619,854

(22) PCT Filed: Aug. 31, 2018

(86) PCT No.: PCT/JP2018/032335
§ 371 (c)(1),
(2) Date: Dec. 5, 2019

(87) PCT Pub. No.: WO2019/045044
PCT Pub. Date: Mar. 7, 2019

(65) Prior Publication Data
US 2020/0158790 A1 May 21, 2020

(30) Foreign Application Priority Data

Aug. 31, 2017 (JP) .............................. JP2017-168034
Jan. 31, 2018 (JP) .............................. JP2018-015858

(51) Int. Cl.
*G01R 31/72* (2020.01)
*G01R 31/34* (2020.01)
(Continued)

(52) U.S. Cl.
CPC ....... *G01R 31/346* (2013.01); *G01R 31/1263* (2013.01); *G01R 31/34* (2013.01); *G01R 31/62* (2020.01); *G01R 31/72* (2020.01)

(58) Field of Classification Search
CPC ...... G01R 31/72; G01R 15/142; G01R 15/16; G01R 15/18; G01R 15/181; G01R 15/183;
(Continued)

(56) References Cited

U.S. PATENT DOCUMENTS 4,897,704 A * 1/1990 Sakurai ................. H01L 21/743
257/557
5,072,186 A * 12/1991 Trampert ............... G01R 31/72
324/546

(Continued)

FOREIGN PATENT DOCUMENTS

JP  06-088849 A  3/1994
JP  2001-215253 A  8/2001
(Continued)

OTHER PUBLICATIONS

International Search Report for PCT/JP2018/032335 dated Nov. 27, 2018 [PCT/ISA/210].
(Continued)

*Primary Examiner* — Vinh P Nguyen
(74) *Attorney, Agent, or Firm* — Sughrue Mion, PLLC

(57) ABSTRACT

Provided is a diagnostic device for a coil including a voltage application unit applying an impulse voltage to the coil; a response voltage detection unit detecting a response voltage from the coil with respect to the impulse voltage; an index calculation unit calculating a determination index indicating an electrical feature of the coil based on the response voltage; and a determination unit determining whether there is an abnormality in a target coil to be diagnosed by comparing the determination index of a reference coil that is the coil that is normal and the determination index of the target coil. At least one of a zero cross point at which the response voltage intersects with a reference voltage and a peak voltage on a positive side and a negative side of the
(Continued)

response voltage is used as the determination index, in addition to a circuit constant of the coil.

20 Claims, 18 Drawing Sheets

(51) Int. Cl.
 *G01R 31/62* (2020.01)
 *G01R 31/12* (2020.01)
(58) Field of Classification Search
 CPC .. G01R 19/2513; G01R 21/06; G01R 21/133; G01R 31/346; G01R 31/1227; G01R 31/52; G01R 31/34; G01R 31/343; G01R 31/62; G01R 27/08; G01R 31/013; G01R 31/50; G01R 31/002; G01R 31/08; G01R 31/12; G01R 31/1263; G01R 31/14; G01R 31/2841; G01R 31/40; G01R 35/00; G06F 3/04162; G06F 3/04164; G06F 3/044; G06F 3/046; H02M 3/156; H02M 2001/0009; H02M 3/157; G01D 5/2086; G01D 5/22; G01D 5/34746; H01H 71/08; H01H 71/125; H01H 33/666; H01H 71/2481; H02K 11/225; H02K 11/042; G01N 27/9046; H01F 2006/001; H02H 9/023
 See application file for complete search history.

(56) References Cited

U.S. PATENT DOCUMENTS

| | | | | | |
|---|---|---|---|---|---|
| 5,514,967 | A | * | 5/1996 | Zelm | G01R 31/1227 324/551 |
| 5,963,410 | A | * | 10/1999 | Iijima | G01R 31/14 361/88 |
| 9,322,881 | B2 | * | 4/2016 | Sakurai | G01R 31/14 |

FOREIGN PATENT DOCUMENTS

| | | |
|---|---|---|
| JP | 2005-037351 A | 2/2005 |
| JP | 2012-058221 A | 3/2012 |
| JP | 2012-242377 A | 12/2012 |

OTHER PUBLICATIONS

Written Opinion for PCT/JP2018/032335 dated Nov. 27, 2018 [PCT/ISA/237].

* cited by examiner

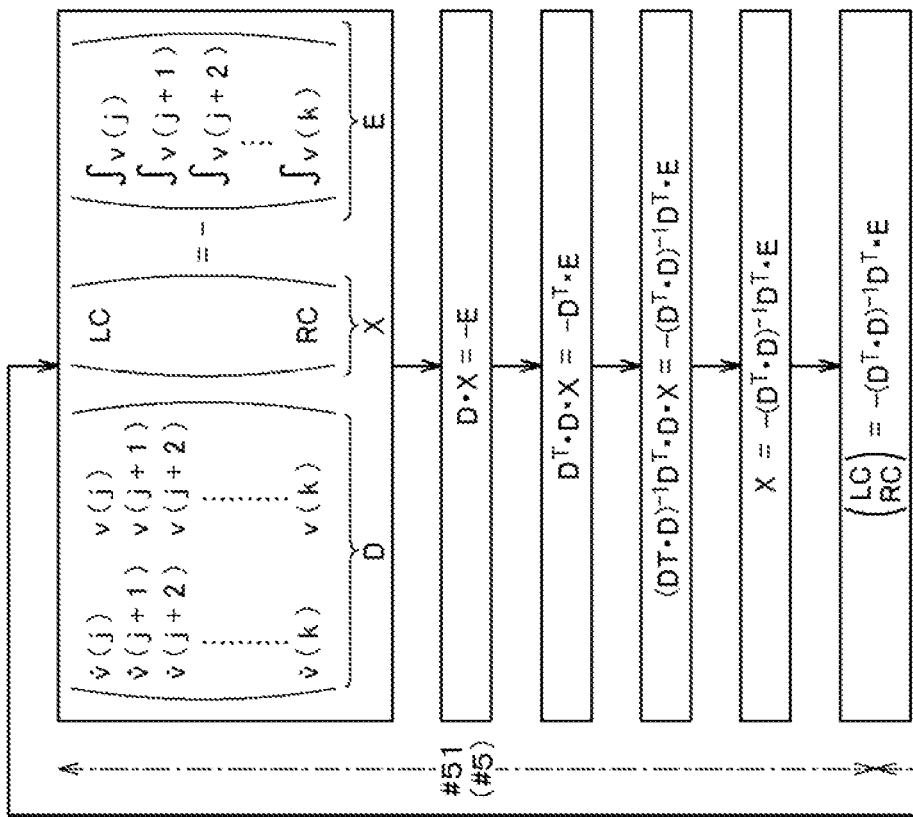
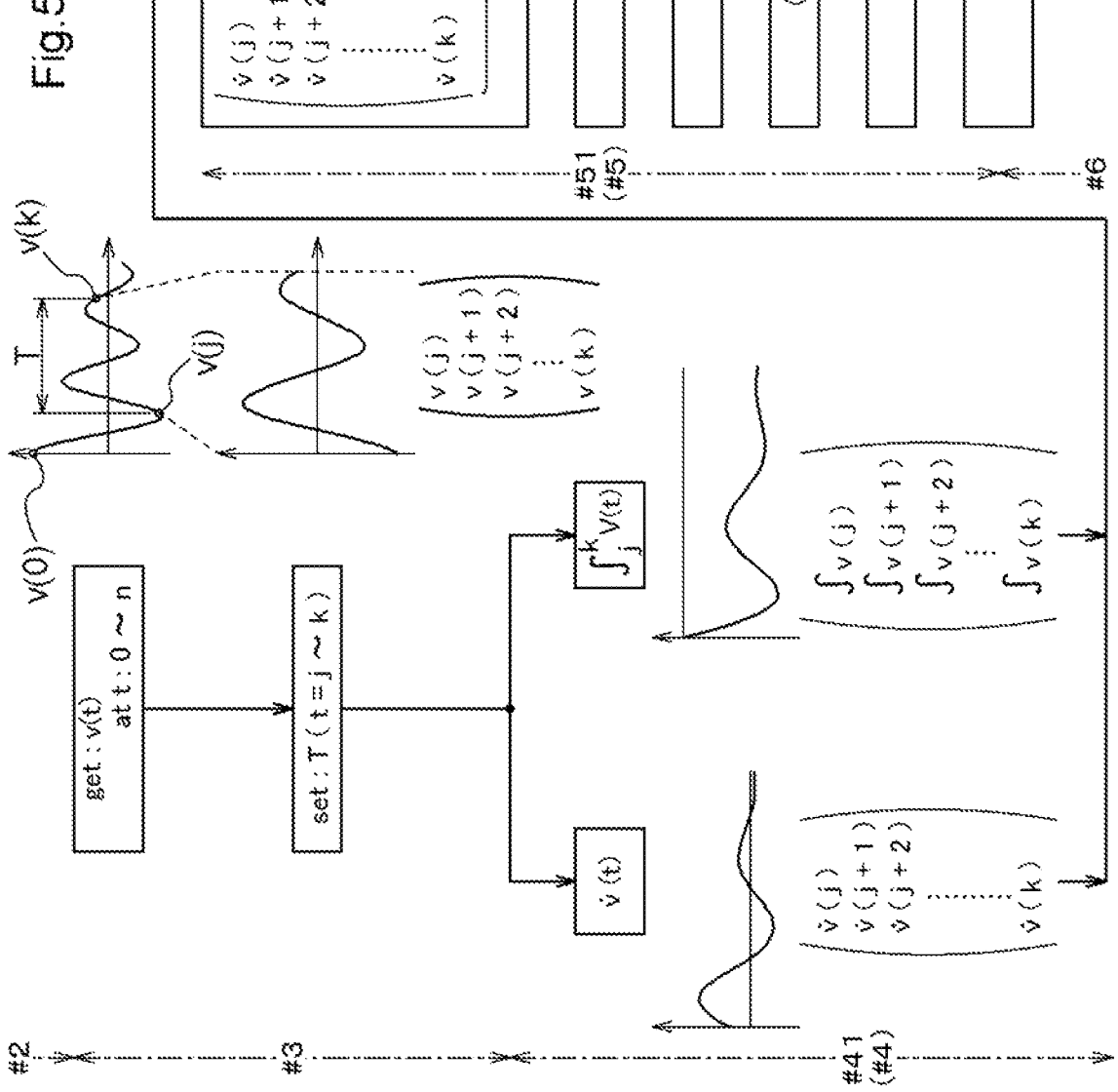
Fig.5

Fig.6
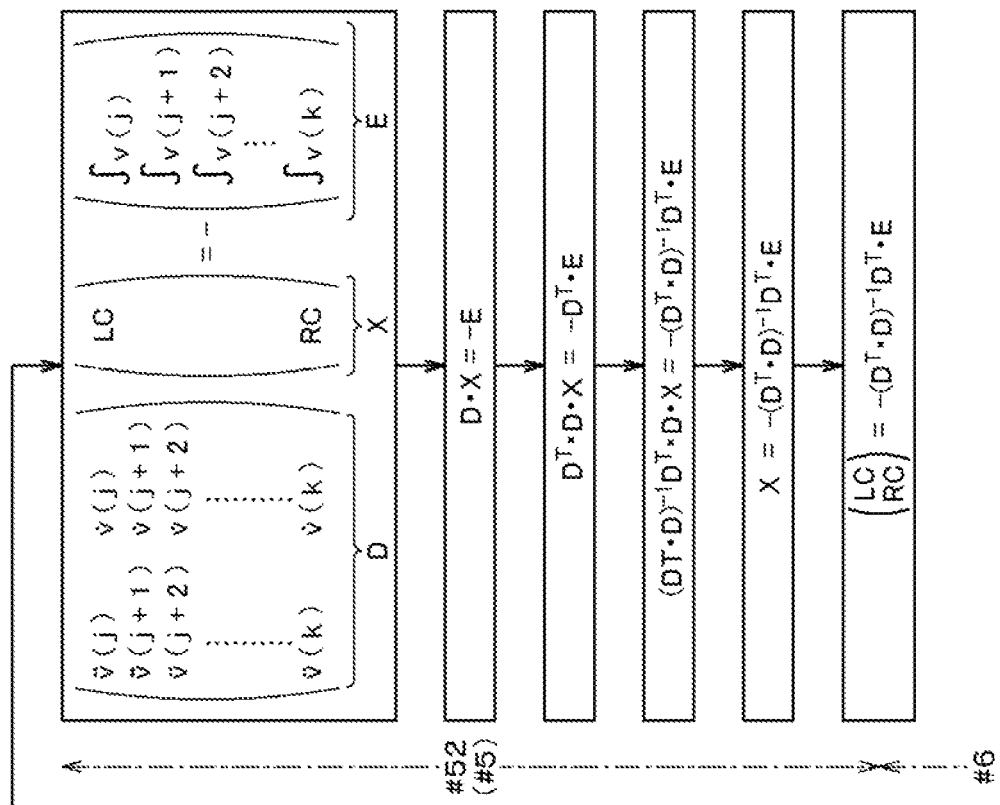
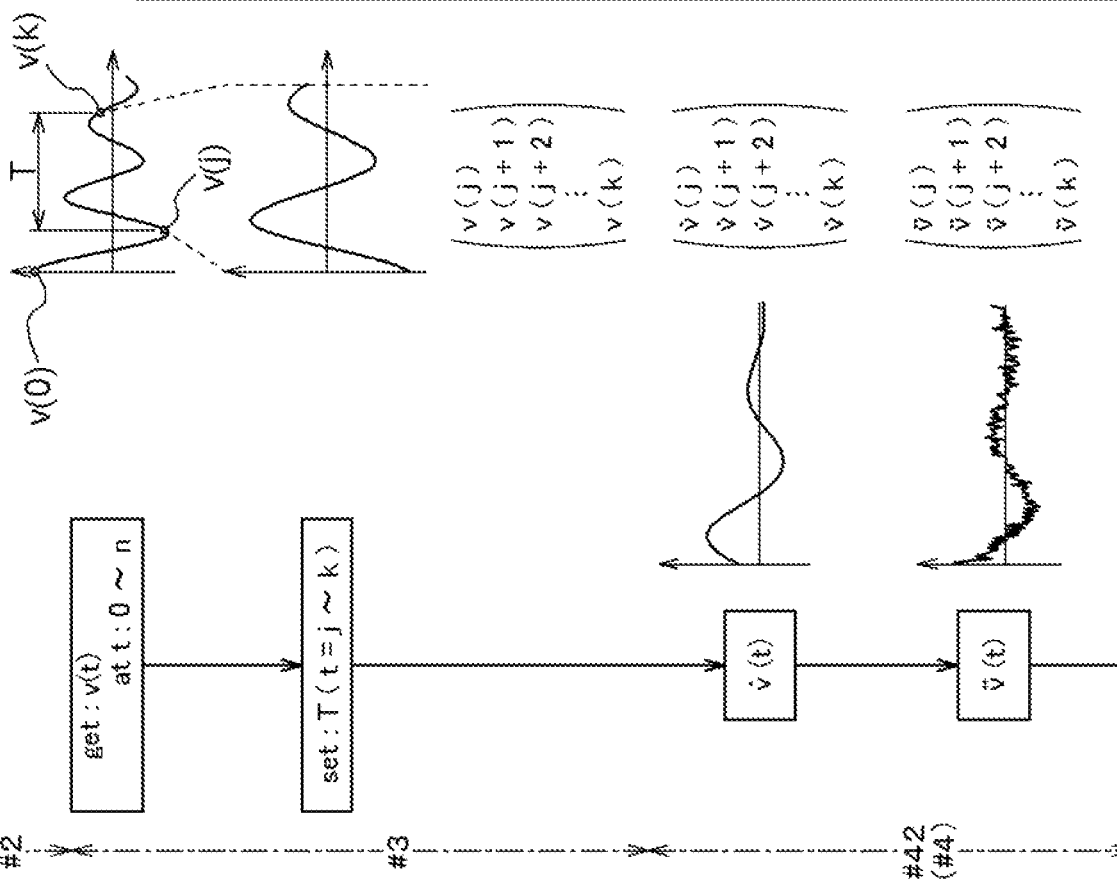

DIAGNOSTIC DEVICE FOR COIL AND DIAGNOSIS METHOD FOR COIL

CROSS REFERENCE TO RELATED APPLICATIONS

This application is a National Stage of International Application No. PCT/JP2018/032335 filed Aug. 31, 2018, claiming priority based on Japanese Patent Application Nos. 2017-168034 filed Aug. 31, 2017 and 2018-015858 filed Jan. 31, 2018.

TECHNICAL FIELD

The present disclosure relates to a diagnostic device for a coil for diagnosing whether there is an abnormality in a coil.

BACKGROUND ART

There is a known technique for applying an impulse voltage to a coil of a rotating electricity or a transformer etc. to observe a response voltage and diagnose the quality of the coil. For example, in Japanese Patent Application Publication No. 2012-242377 (JP 2012-242377 A), feature amounts (LC and RC) of a coil are calculated based on a response voltage, a derivative voltage acquired by differentiating the response voltage, and a second order derivative voltage (second derivative) acquired by differentiating the derivative voltage. Here, LC is the product of an inductance and a capacitance and RC is the product of a resistance (resistance component) and a capacitance ([0014] to [0015] etc.).

A decrease in insulation between conductors that form the coil is an example of an abnormality of the coil to be diagnosed. However, even when the insulation between the conductors that have the same electrical potential in the coil decreases, there is hardly any effect on the electrical performance. Thus, it is difficult to diagnose the quality of the coil based on the feature amounts (LC and RC) regarding a circuit constant. Since the decrease in insulation has hardly any effect on the electrical performance, there are practically no problems. However, from the viewpoint of production management, it is preferable that it be taken into consideration that there is a factor of poor insulation occurring in the coil and that there is a possibility of poor insulation occurring in places that effect the electrical performance. Thus, it is preferable that poor insulation in places that have the same electrical potential be appropriately detected.

RELATED ART DOCUMENTS

Patent Documents

Patent Document 1: Japanese Patent Application Publication No. 2012-242377 (JP 2012-242377 A)

SUMMARY OF THE DISCLOSURE

Problem to be Solved by the Various Aspects of the Disclosure

In view of the above circumstances, it is desired that a technique be provided, in which a quality of a coil in a wider target range of the coil is diagnosed based on a response voltage acquired by applying an impulse voltage.

Means for Solving the Problem

In one aspect, a diagnostic device for a coil in view of the above includes:

a voltage application unit that applies an impulse voltage to a coil;

a response voltage detection unit that detects a response voltage from the coil with respect to the impulse voltage;

an index calculation unit that calculates a determination index indicating an electrical feature of the coil based on the response voltage; and a determination unit that determines whether there is an abnormality in a target coil that is the coil to be diagnosed by comparing the determination index of a reference coil that is the coil that is normal and the determination index of the target coil, wherein at least one of a zero cross point at which the response voltage intersects with a reference voltage that is prescribed, and a peak voltage on a positive side and a negative side of the response voltage is used as the determination index, in addition to a circuit constant of the coil.

The technical features of the diagnostic device for the coil can be applied to a diagnostic method for a coil. For example, the diagnostic method for the coil can contain various steps including features of the diagnostic device for the coil described above. As a matter of course, the diagnostic method for the coil can accomplish the operation and the effects of the diagnostic device for the coil described above.

As one aspect, the diagnostic method for the coil in this case includes:

a voltage applying step of applying an impulse voltage to a coil;

a response voltage detection step of detecting a response voltage from the coil with respect to the impulse voltage;

an index calculation step of calculating a determination index indicating an electrical feature of the coil based on the response voltage; and a determination step of determining whether there is an abnormality in a target coil that is the coil to be diagnosed by comparing the determination index of a reference coil that is the coil that is normal and the determination index of the target coil, wherein at least one of a zero cross point at which the response voltage intersects with a reference voltage that is prescribed, and a peak voltage on a positive side and a negative side of the response voltage is used as the determination index, in addition to a circuit constant of the coil.

The decrease in insulation between conductors that form the coil is an example of an abnormality of the coil to be diagnosed. Even when the insulation between the conductors of the same electrical potential deteriorates in the coil, the effect on the electrical performance is low. Thus, the effect of the circuit constant of the coil as the determination index decreases. According to experiments and simulations carried out by the inventors, it is confirmed that when the insulation between the conductors in the coil that have the same electrical potential deteriorates, change is observed in the zero cross point at which the response voltage intersects with the reference voltage and in the peak voltage on the positive side or the negative side of the response voltage. That is, when at least one of the zero cross point at which the response voltage intersects with the reference voltage and the peak voltage on the positive side or the negative side of the response voltage is used in addition to the circuit constant of the coil, it is possible to appropriately detect the decrease in insulation between the conductors in the coil that have the same electrical potential and the decrease in insulation between the conductors in the coil that have different electrical potentials. With the configuration described above, it is possible to diagnose the quality of the coil in a wider target range of the coil based on the response voltage acquired by applying the impulse voltage.

Further features and advantages of the diagnostic device for the coil and the diagnostic method for the coil will be apparent from the following description of the embodiment that is given with reference to the accompanying drawings.

BRIEF DESCRIPTION OF THE DRAWINGS

FIG. 5 is an explanatory diagram illustrating a determination index calculation principle of the response voltage, a derivative voltage, and an integral voltage.

FIG. 6 is an explanatory diagram illustrating a determination index calculation principle of the response voltage, the derivative voltage, and a second order derivative voltage.

DETAILED DESCRIPTION

Figure 1:
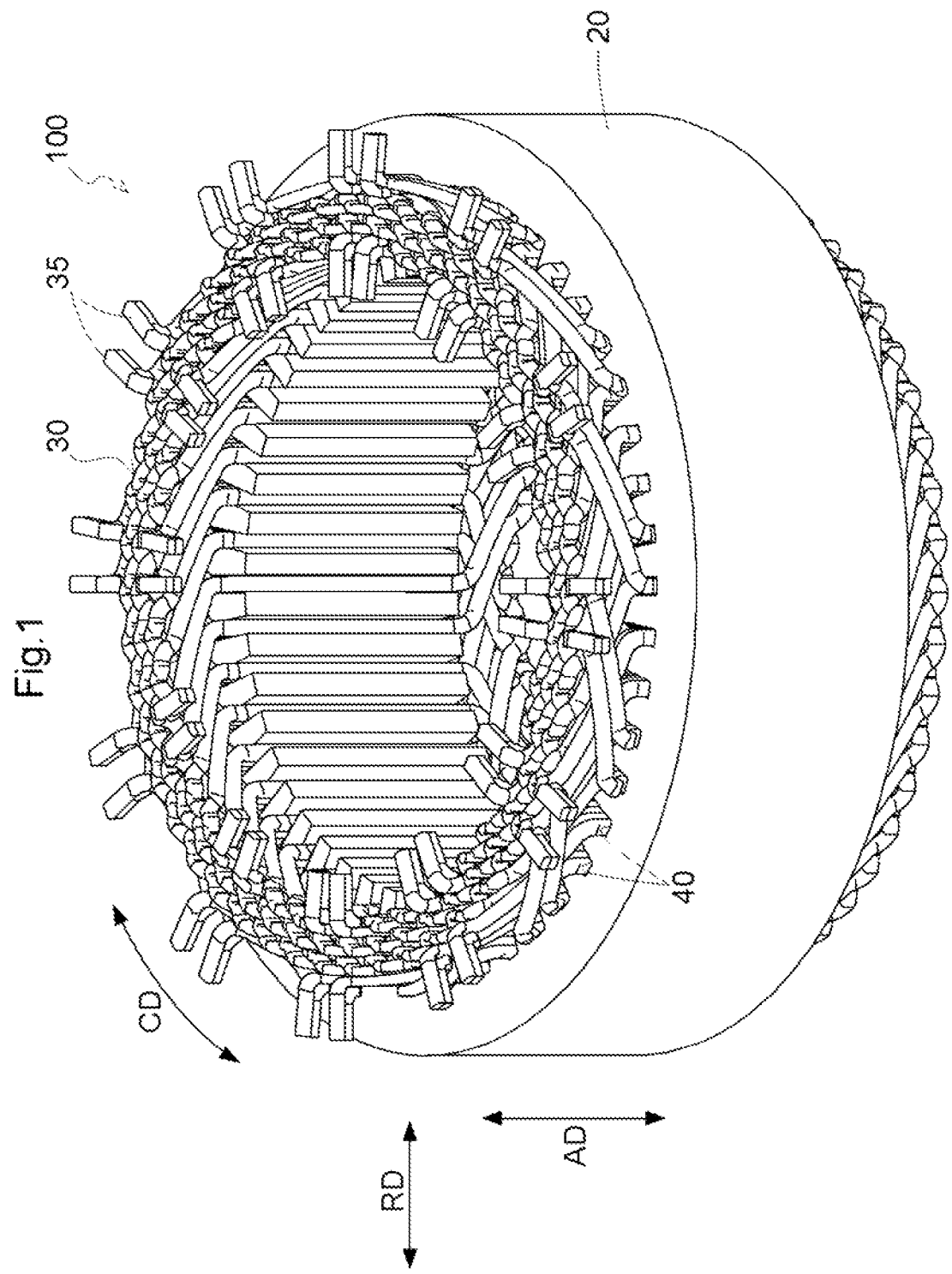
FIG. 1 is a perspective view illustrating an example of a stator of a rotary electric machine in which a coil is used.

An embodiment of a diagnostic device for a coil of a rotary electric machine or a transformer will be described based on the drawing. Here, as shown in FIG. 1, a diagnostic device 1 that diagnoses the quality of a coil 30 wound around a stator 100 of a rotary electric machine. As illustrated in FIG. 1, the stator 100 has a core 20 and a coil 30 that is wound around the core 20. In the embodiment, the stator 100 has a three-phase coil that generates a rotating magnetic field with a three-phase alternating current and that corresponds to a U-phase, a V-phase, and a W-phase. Each of phase windings of the coil 30 are electrically connected with each other at an intermediate point N (N1, N2). The core 20 is formed using a magnetic material. In the core 20, a plurality of slots 40 are formed at regular intervals along a circumferential direction CD. Here, each slot 40 is provided with an opening portion in an axial direction AD and inside in a radial direction RD. The slot 40 for the U-phase, the slot 40 for the V-phase, and the slot 40 for the W-phase are disposed so as to repeatedly appear along the circumferential direction CD.

The coil 30 is formed using linear conductors 35 having conductivity such as copper or aluminum. An insulating layer made of material having electrical insulation such as resin is formed on surfaces of the linear conductors 35. In the embodiment, the coil 30 that is formed by the linear conductors 35 that are rectangular wires is illustrated, in which each linear conductor 35 has a rectangular section as seen in a direction orthogonal to an extending direction.

If the insulating layer is insufficient or the insulating layer is degraded due to damage etc., the insulation of the linear conductors 35 that form the coil 30 deteriorates. As a result, there is a possibility of a short circuit occurring between the adjacent linear conductors 35 or a short circuit occurring between the linear conductor 35 and the ground (grounding). The diagnostic device 1 detects poor insulation that may lead to a short circuit or grounding as an abnormality of the coil 30 and diagnoses the quality of the coil 30. When the coil 30 is disconnected, when the conductors short circuit to each other, or when the conductor is grounded, electrical characteristics of the coil 30 is significantly varied. In the case of poor insulation, a resistance between the adjacent linear conductors 35 is varied. However, this is not a noticeable variation in the electrical characteristics of the coil 30 and thus, it cannot be easily detected. It is thus determined whether there is poor insulation based on a response voltage generated when an impulse voltage that is a large voltage is applied to the coil 30.

Figure 2:
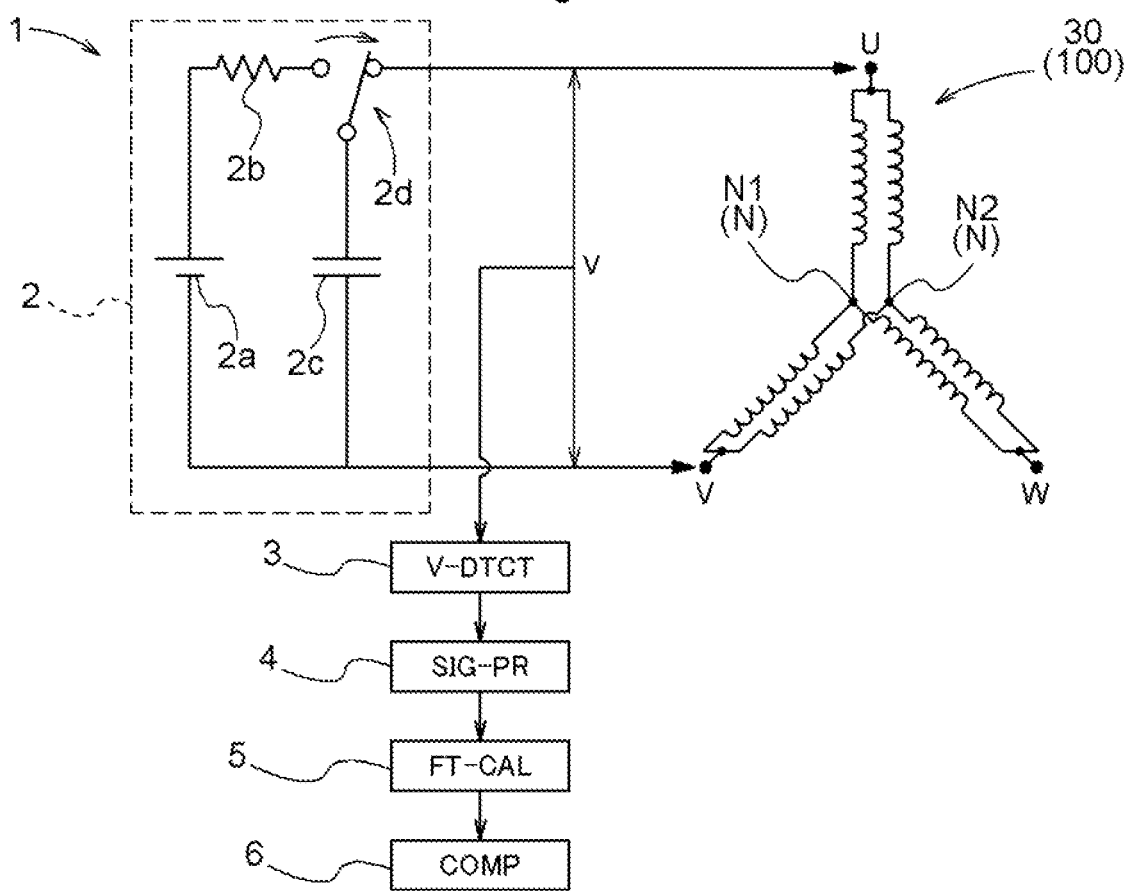
FIG. 2 is a block diagram illustrating an example of a diagnostic device for a coil that performs an impulse test.
Figure 3:
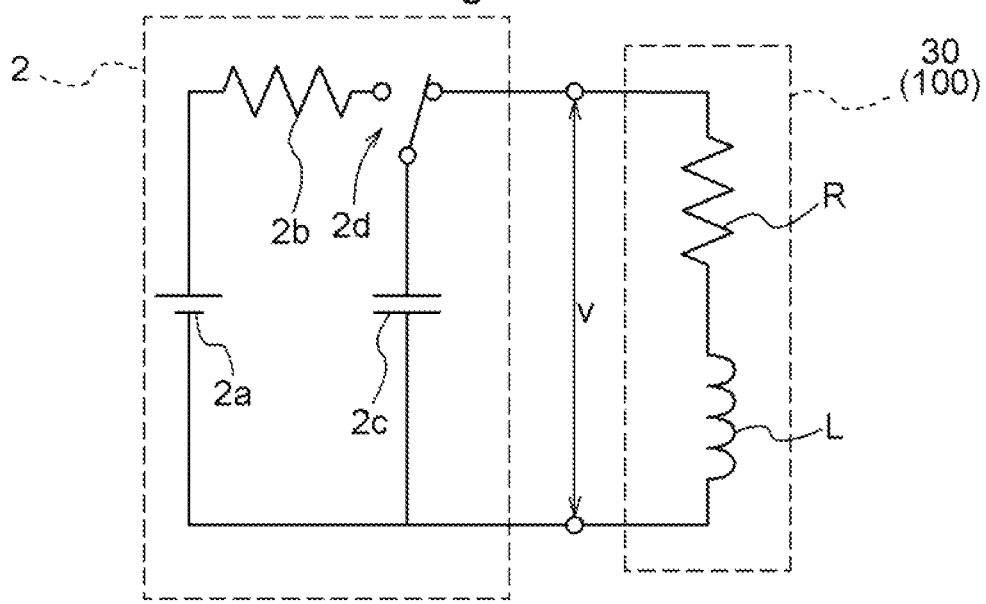
FIG. 3 is an equivalent circuit diagram of the impulse test.

FIG. 2 illustrates a system configuration of the diagnostic device 1 that diagnoses the coil 30 with an impulse test. FIG. 3 illustrates an equivalent circuit of the impulse test. As illustrated in FIG. 2, the diagnostic device 1 includes a voltage application unit 2, a response voltage detection unit (V-DTCT) 3, a signal processing unit (SIG-PR) 4, a feature amount calculation unit (FT-CAL) 5, and a determination unit (COMP) 6.

The voltage application unit 2 is a functional unit that applies an impulse voltage to the coil 30. The voltage application unit 2 includes a direct current power source 2a, a current limit resistor 2b, a capacitor 2c, and a charging/discharging switch 2d. Electrical charge is charged in the capacitor 2c while the capacitor 2c is connected to the direct current power source 2a via the charging/discharging switch 2d and the current limit resistor 2b. Here, when the capacitor 2c and the coil 30 are electrically connected via the charging/discharging switch 2d, the electrical charge that is charged in the capacitor 2c is discharged to the coil 30 all at once via the charging/discharging switch 2d. An impulse voltage thus is applied to the coil 30 (FIGS. 5 and 6: voltage applying step #2).

Figure 4:
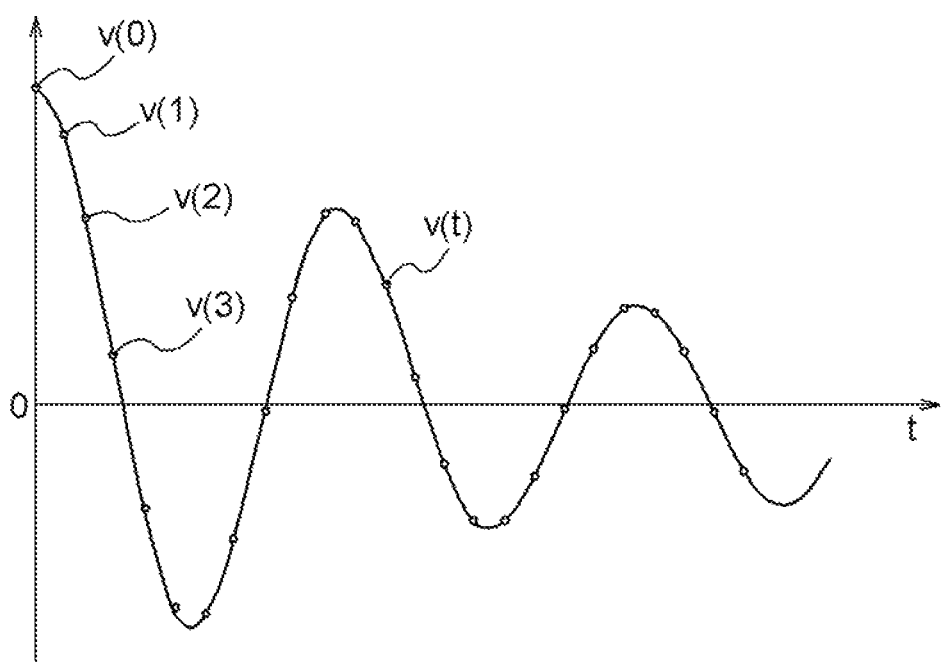
FIG. 4 is a waveform chart illustrating a response voltage and a sampling principle of the response voltage.

The response voltage detection unit 3 detects a response voltage from the coil 30 with respect to the impulse voltage (FIGS. 5 and 6: response voltage detection step #3). As illustrated in FIG. 4, the response voltage detection unit 3 acquires a response voltage v(t) at time t at prescribed sampling intervals. In the embodiment, the response voltage detection unit 3 is configured with an A/D converter as a core, in which the A/D converter performs analog to digital conversion to acquire the response voltage.

As described below with reference to FIG. 5, the signal processing unit 4 differentiates the response voltage to calculate a derivative voltage and integrates the response voltage to calculate an integral voltage (FIG. 5: signal processing step #4 (#41)). In the embodiment, the response voltage v(t) at each time t at which the response voltage detection unit 3 acquires the response voltage v(t) is differentiated and integrated to calculate the derivative voltage and the integral voltage, respectively. In the embodiment, the signal processing unit 4 is configured with a processor such as a microcomputer or a digital signal processor (DSP) as a core.

The feature amount calculation unit 5 calculates a determination index (feature amount) that indicates an electrical feature of the coil 30 based on the response voltage, the derivative voltage, and the integral voltage (FIG. 5: feature amount calculation step #5 (#51)). The feature amount calculation unit 5 is also configured with a processor such as a microcomputer or a DSP as a core. The feature amount calculation step #5 can be regarded as an index calculation step. As illustrated in the equivalent circuit in FIG. 3, the coil 30 can be illustrated as a series circuit of the inductance L and the resistance (resistance component) R. Here, if an interline capacitance of the coil 30 is regarded as C, the product LC of the inductance and the capacitance and the product RC of the resistance (resistance component) and the interline capacitance can be regarded as the feature amount indicating the electrical feature of the coil 30. The feature amounts "LC" and "RC" are determination indexes for the determination unit 6 to determine the quality of the coil 30. Thus, the feature amount calculation unit 5 can be referred to as an index calculation unit. The feature amounts (determination index) are not limited to the "LC" and the "RC", and may be the inductance L of the coil 30, the resistance R of the coil, and the interline capacitance of the coil 30.

The determination unit 6 determines whether a target coil that is the coil 30 to be diagnosed has an abnormality based on the feature amount (determination index) of the target coil (FIGS. 5 and 6: determination step #6). The determination unit 6 is also configured with a processor such as a microcomputer or a DSP as a core. As a matter of course, the response voltage detection unit 3, the signal processing unit 4, the feature amount calculation unit 5, and the determination unit 6 may be configured of a processor chip including an A/D converter. For example, the determination unit 6 determines the quality of the target coil based on a comparison of the feature amount (determination index) of the target coil and a feature amount (determination index) of a reference coil that is the coil 30 that is normal.

As illustrated in FIG. 5, in the response voltage detection step #3, the response voltage detection unit 3 acquires the response voltage v(t) at a time t throughout a period in which the time t=0 to n (n: any natural number). As a matter of course, since the time-serial resolution of the response voltage become higher, it is preferable that the sampling intervals be shorter. Since the voltage resolution of the response voltage become higher, it is preferable that the resolution of the A/D converter be higher. However, since a data amount is larger when the resolution is higher, it is preferable that a sufficient amount of capacity be ensured in a storage element or a storage device such as a memory. The storage element or the storage device is included in the response voltage detection unit 3.

Figure 8:
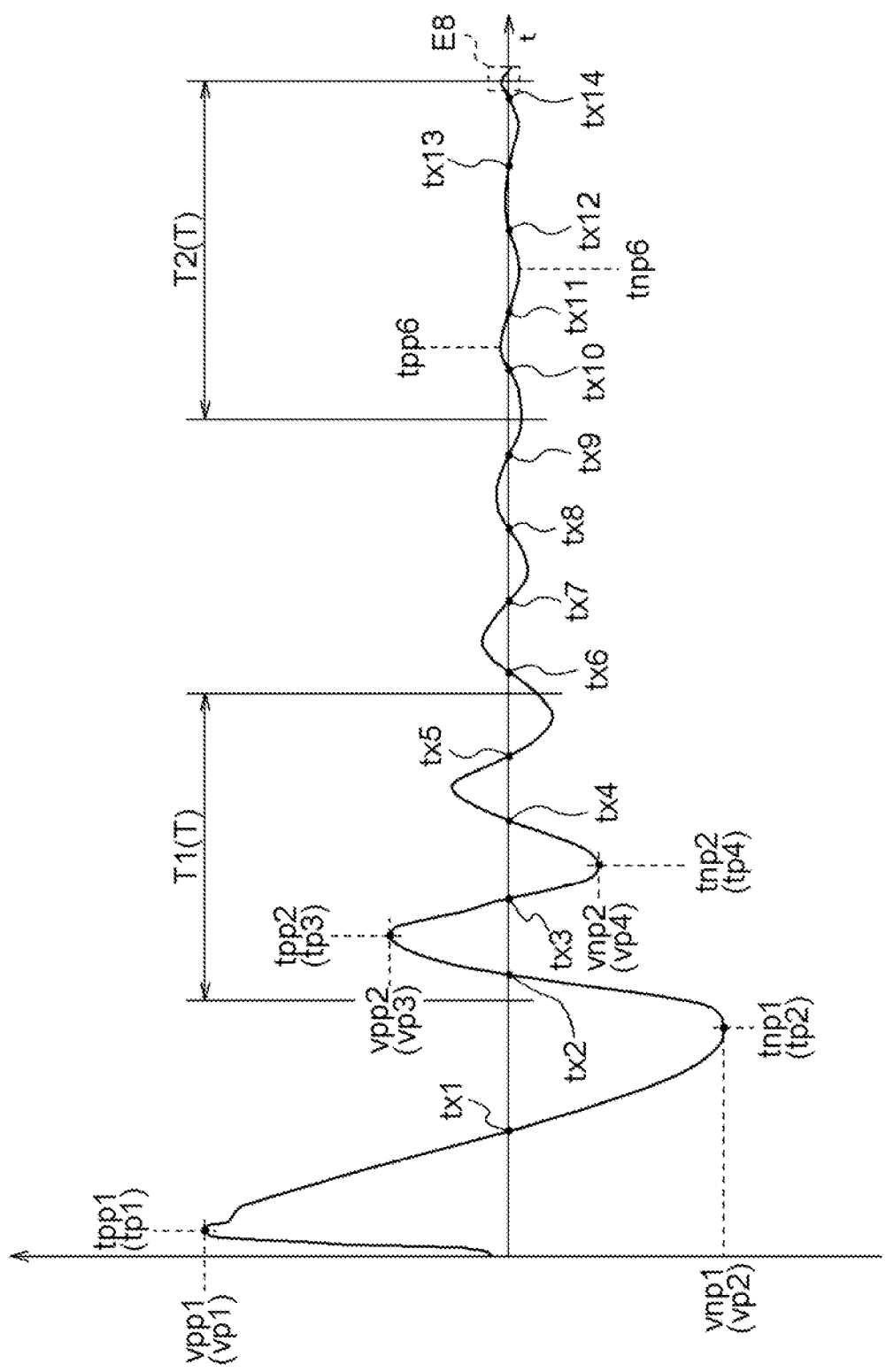
FIG. 8 is a waveform chart illustrating an example of the response voltage.

The response voltage detection unit 3 sets a range "T" of the response voltage used for calculating the feature amount. A waveform chart in FIG. 8 illustrates an example of the response voltage. In an initial state, a distortion is observed in a response voltage waveform. As described above, the voltage application unit 2 discharges the electrical charge stored in the capacitor 2c to the coil 30 all at once via the charging/discharging switch 2d so as to apply the impulse voltage. A large current temporarily flows into the charging/discharging switch 2d. Thus, in many cases, the charging/discharging switch 2d is configured by connecting a plurality of switching elements in parallel. Since there may be a slight time difference when the switching elements are switched, the waveform may be disturbed in the initial response voltage. Thus, it is preferable that the initial response voltage be not included in the data for determining the quality of the coil 30. There is a limit to the capacity of the storage element and the storage device. As illustrated in FIG. 5, the response voltage detection unit 3 sets the range "T" of the response voltage used for calculating the feature amount from the time t(j) to the time t(k) (j, k: a natural number equal to or less than n).

As illustrated in FIG. 5, the response voltage in which the range "T" of effective data is set can be indicated as a matrix in which the elements are $\{v(j), v(j+1), v(j+2), \ldots, v(k)\}$. In the signal processing step #4 (#41), the signal processing unit 4 differentiates and integrates the response voltage to calculate the derivative voltage and the integral voltage, respectively. Similar to the response voltage, the derivative voltage and the integral voltage can be indicated as a matrix in which the elements are differential values and integral values at each time t within the range from time t=j to time t=k.

The response voltage, the derivative voltage, the integral voltage, and the feature amounts (LC, RC) can be indicated as a determinant illustrated in FIG. 5. Here, when the matrix including the response voltage and the integral voltage is regarded as "D", the matrix of the feature amounts (LC, RC) is regarded as "X", and the matrix of the integral voltage is regarded as "E", the determinant can be indicated by the formula (1) below.

$$D \cdot X = -E \quad (1)$$

When both sides of the formula (1) are multiplied by $D^T$ that is a transposed matrix of "D" so as to calculate "X" that is the feature amount from the formula (1), the formula (2) is formed.

$$D^T \cdot D \cdot X = -D^T \cdot E \quad (2)$$

When both sides of the formula (2) are multiplied by an inverse matrix so that only "X" remains on the left side of the formula (2), the formula (4) is formed via the formula (3). When an inverse matrix cannot be formed due to the relationship between the number of rows and the number of columns in "$D^T \cdot D$", it is preferable that a pseudo-inverse matrix be used.

$$(D^T \cdot D)^{-1} \cdot D^T \cdot D \cdot X = -(D^T \cdot D)^{-1} \cdot D^T \cdot E \quad (3)$$

$$X = -(D^T \cdot D)^{-1} \cdot D^T \cdot E \quad (4)$$

As described above, "X" is the matrix of the feature amounts (LC, RC). Thus, it is possible to derive the feature amounts (LC, RC) by calculating the right side of the formula (4). That is, it is possible to derive the feature amounts (LC, RC) from the acquired response voltage by following the procedure indicated in the feature amount calculation step #5 (#51) in FIG. 5.

The difference between a good product and a defective product (coil 30 having a poor insulation part) can be distinguished in a two-dimensional space in which the elements of the feature amounts (LC, RC) are the axes, depending on a position and a degree of poor insulation, for example. That is, the determination unit 6 can determine the good product and the defective product in the two-dimensional space (determination step #6). The detailed description of such a determination method will be omitted, since the determination method is known, as disclosed in Japanese Patent Application Publication No. 2012-242377 (JP 2012-242377 A) presented in the background art in the description.

The determination unit 6 may compare (perform relative identification of) features of a cluster (group) of good products (reference coils) and features of a cluster of coils to be diagnosed (target coils). For example, the determination unit 6 may calculate a quantitative value such as a distance or a degree of similarity (association) so as to perform determination. For example, the Euclidean distance or the Mahalanobis distance may be used as the distance. In addition to the methods described above, the Kernel density functional method or the one class support vector machine (SVM) may be used to perform determination.

The derivation of the feature amounts (LC, RC) is not limited to the form described with reference to the signal processing step #4 (#41) and the feature amount calculation step #5 (#51) in FIG. 5, in which the response voltage, the derivative voltage, and the integral voltage are used. As illustrated in the signal processing step #4 (#42) and the feature amount calculation step #5 (#52) in FIG. 6, the response voltage, the derivative voltage, and the second order derivative voltage may be used to derive the feature amounts (LC, RC). The way of acquiring the response voltage in the response voltage detection step #3 and the way of setting the range "T" of the response voltage used for calculation of the feature amount in the form illustrated in FIG. 6 are the same as the form illustrated in FIG. 5. In the form illustrated in FIG. 5, the signal processing unit 4 differentiates and integrates the response voltage to calculate the derivative voltage and the integral voltage, respectively (#41). However, in the form illustrated in FIG. 6, the signal processing unit 4 differentiates the response voltage and further differentiates the derivative voltage to calculate the derivative voltage and the second order derivative voltage (#42). Similar to the response voltage and the derivative voltage, the second order derivative voltage can be indicated as a matrix in which the elements are second order differential values at each time t within the range from time t=j to time t=k.

The response voltage, the derivative voltage, the second order derivative voltage, and the feature amounts (LC, RC) can be indicated as matrices illustrated in FIG. 6. In the form illustrated in FIG. 5, the matrix including the response voltage and the derivative voltage is regarded as "D", the matrix including the feature amounts (LC, RC) is regarded as "X", and the matrix including the integral voltage is regarded as "E" (#51). However, in the form illustrated in FIG. 6, the matrix including the derivative voltage and the second order derivative voltage is regarded as "D" and the matrix including the response voltage is regarded as "E" (#52). The formula using "D", "X", and "E" is the same as the formula (1) described above. The feature amounts (LC, RC) can be derived by rearranging the formula (1) as in the formulas (2) to (4) described above.

As illustrated in FIG. 6, the waveform of the second order derivative voltage includes many noise components since the noise included in the response voltage is acuminated. The second order derivative voltage is an element of the matrix "D". Since the matrix "D" is used in the formula (4), the noise components affect the accuracy of the feature amounts (LC, RC).

Figure 7:
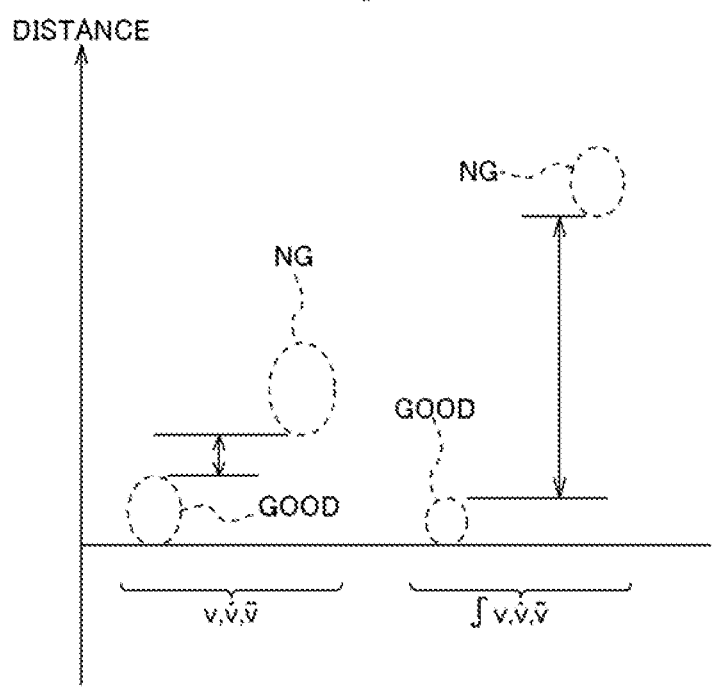
FIG. 7 is an explanatory diagram illustrating a principle of distinguishing a good product and a defective product.

FIG. 7 is an explanatory diagram illustrating a principle of distinguishing the good product and the defective product. Here, the distance is used as a quantitative value. The left side indicates a distribution of good products (GOOD) and defective products (NG) when the feature amount is derived based on the response voltage, the derivative voltage, and the second order derivative voltage. The right side indicates a distribution of good products (GOOD) and defective products (NG) when the feature amount is derived based on the response voltage, the derivative voltage, and the integral voltage. Here, the results of simulations carried out by inventors are schematically plotted. As illustrated in FIG. 7, the good products and the defective products are separated more clearly and a clear determination is possible, when the feature amounts are derived based on the response voltage, the derivative voltage, and the integral voltage.

As described with reference to FIG. 8 etc., the response voltage detection unit 3 sets the range "T" of the data so as not to include the initial response voltage in the data for determining the quality of the coil 30, since there is a distortion in the waveform of the initial response voltage. It is preferable that the response voltage detection unit 3 set the range "T" of the data to be at or after a first zero cross point tx1 at which the response voltage intersects with the reference voltage (amplitude center, for example at zero volts) for the first time. That is, it is preferable that the signal processing unit 4 calculate the derivative voltage and the integral voltage based on the data at or after the first zero cross point at which the response voltage intersects with the reference voltage. It is also preferable that the feature amount calculation unit 5 calculate the feature amount based on the response voltage, the derivative voltage, and the integral voltage at or after the first zero cross point. As a matter of course, the same applies to the case in which the second order derivative voltage is used instead of the integral voltage.

The amplitude center corresponds to a position of an inflection point at an amplitude central portion of the response voltage waveform. When the response voltage does not include a direct current component (offset voltage), the reference voltage can be regarded as zero volts. When the response voltage includes the direct current component, the reference voltage can be regarded as a voltage of the direct current component (offset voltage). Even when the response voltage includes the direct current component (offset voltage), the zero volts of an alternating current component can be regarded as the reference voltage. Regardless of the value of the reference voltage, the point at which the response voltage intersects with reference voltage can thus be called the "zero cross point".

As illustrated in FIG. 8, the oscillating response voltage becomes nearly stable past a first peak point in a positive direction or a negative direction (first peak point tp1, first plus peak point tpp1 in the embodiment). It is preferable, therefore, that the quality of the coil 30 be determined using the data past the first peak point tp1 and at or after the first zero cross point at which the response voltage intersects with reference voltage for the first time. The peak point indicates a position of a peak and includes both a position of a peak in the positive direction (a peak in the narrow sense) and a position of a peak in the negative direction (so-called bottom).

Considering that response voltage becomes stable, it is preferable that the response voltage detection unit 3 set the range "T" of the data at or after the peak point in the positive direction or the negative direction that is immediately after the first zero cross point tx1 (second peak point tp2, first minus peak point tnp1 in the embodiment). The "T" can be set in a first period T1 illustrated in FIG. 8. In this case, the signal processing unit 4 calculates the derivative voltage and the integral voltage based on the data at or after the second peak point tp2 that is the peak point on a positive side or a negative side immediately after the first zero cross point. The feature amount calculation unit 5 calculates the feature amount based on the response voltage, the derivative voltage, and the integral voltage at or after the second peak point tp2. As a matter of course, the same applies to the case in which the second order derivative voltage is used instead of the integral voltage.

Figure 9:
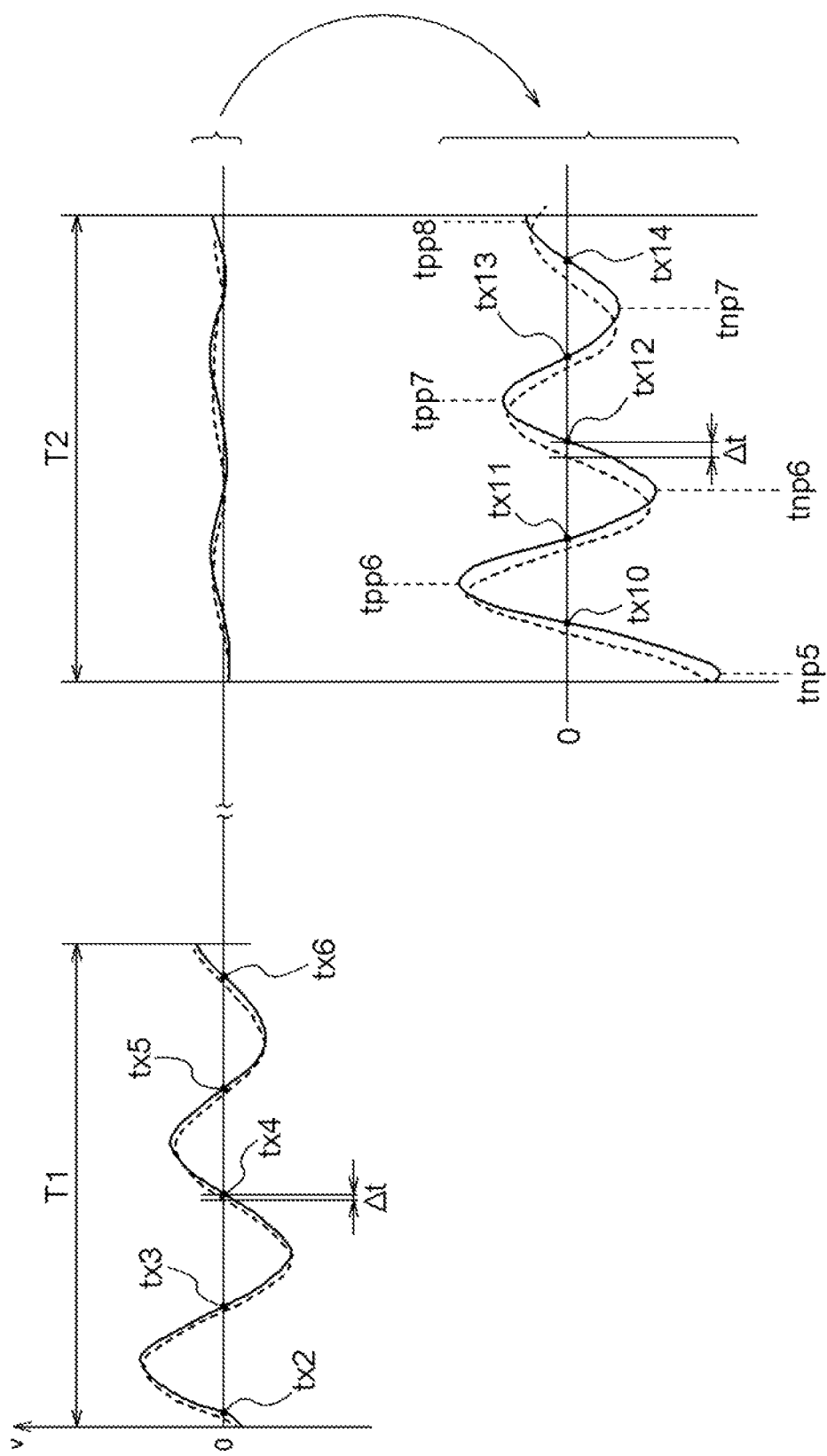
FIG. 9 is a waveform chart illustrating a difference between the response voltage of the good product and the response voltage of the defective product.

According to experiment analysis by the inventors, it is confirmed that the difference between the feature amounts of the good product and the defective product is increased by delaying the range "T" of the data. For example, it is confirmed that the difference between the feature amounts is further increased by changing the range "T" of the data from the first period T1 to a second period T2 in FIG. 8. FIG. 9 illustrates the response voltage of the good product (solid line) and the response voltage of the defective product (broken line) during the first period T1 and the second period T2. With reference to FIG. 9, a time difference Δt (phase difference) between the response voltages during the second period T2 is larger than the time difference Δt between the response voltages during the first period T1. As a matter of course, since the time difference Δt between the derivative voltages, the integral voltages, or the second order derivative voltages are increased, the difference between the feature amounts (LC, RC) of the good product and the defective product that are derived by using the derivative voltages, the integral voltages, or the second order derivative voltages are also increased.

As it is clear in FIGS. 8 and 9, the amplitude of the response voltage is smaller during the second period T2 compared to the amplitude of the response voltage during the first period T1. When the resolution of the voltage is not sufficient, there is a possibility that the resolution of the voltage decreases and the accuracy decreases while the time difference Δt increases during the second period T2. Thus, there are cases in which it is preferable that the range "T" of the data to be used be set to be the first period T1 when the resolution of the A/D converter that configures the response voltage detection unit 3 is low etc. When a reference voltage of the A/D converter is variable and a dynamic range is variable, the dynamic range may be changed and the range "T" of the data may be set to the second period T2 in accordance with the attenuation of the amplitude of the reference voltage.

Figure 10:
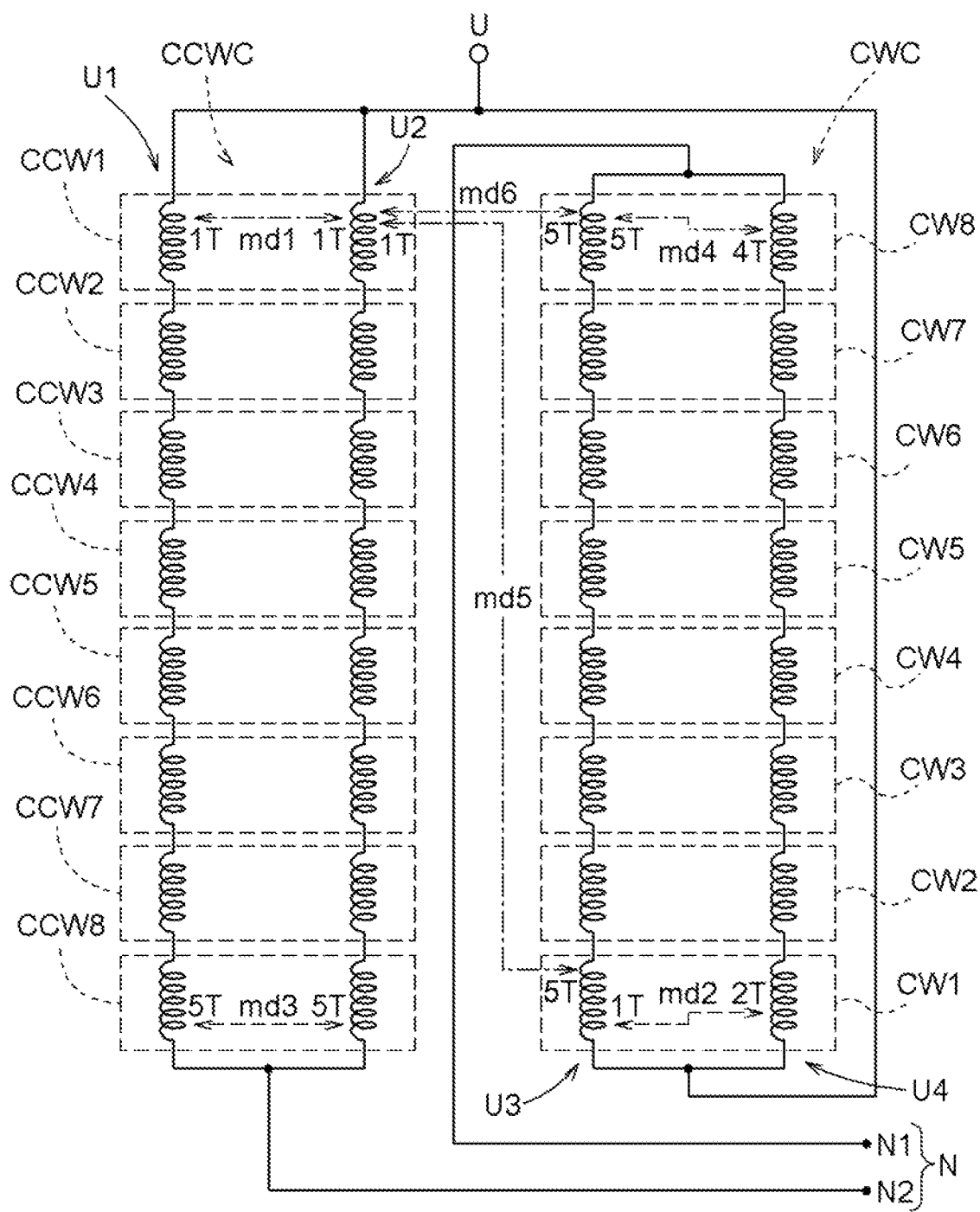
FIG. 10 is a winding diagram of a coil set of a U-phase.

As described above, in the core 20, the slots 40 are formed at regular intervals along the circumferential direction CD. Here, each slot 40 is provided with the opening portion in the axial direction AD and inside in the radial direction RD. The slot 40 for the U-phase, the slot 40 for the V-phase, and the slot 40 for the W-phase are disposed so as to repeatedly appear along the circumferential direction CD. In the embodiment, the number of magnetic poles of a rotor and the number of the slots 40 for each phase is "two". Also in the embodiment, a form is shown in which the slots 40 for the phases are disposed in the core 20 in a repeated manner of two slots for the U-phase, two slots for the V-phase, and two slots for the W-phase along the circumferential direction CD. FIG. 10 illustrates a winding diagram of a coil set of one phase (U-phase, for example).

Figure 11:
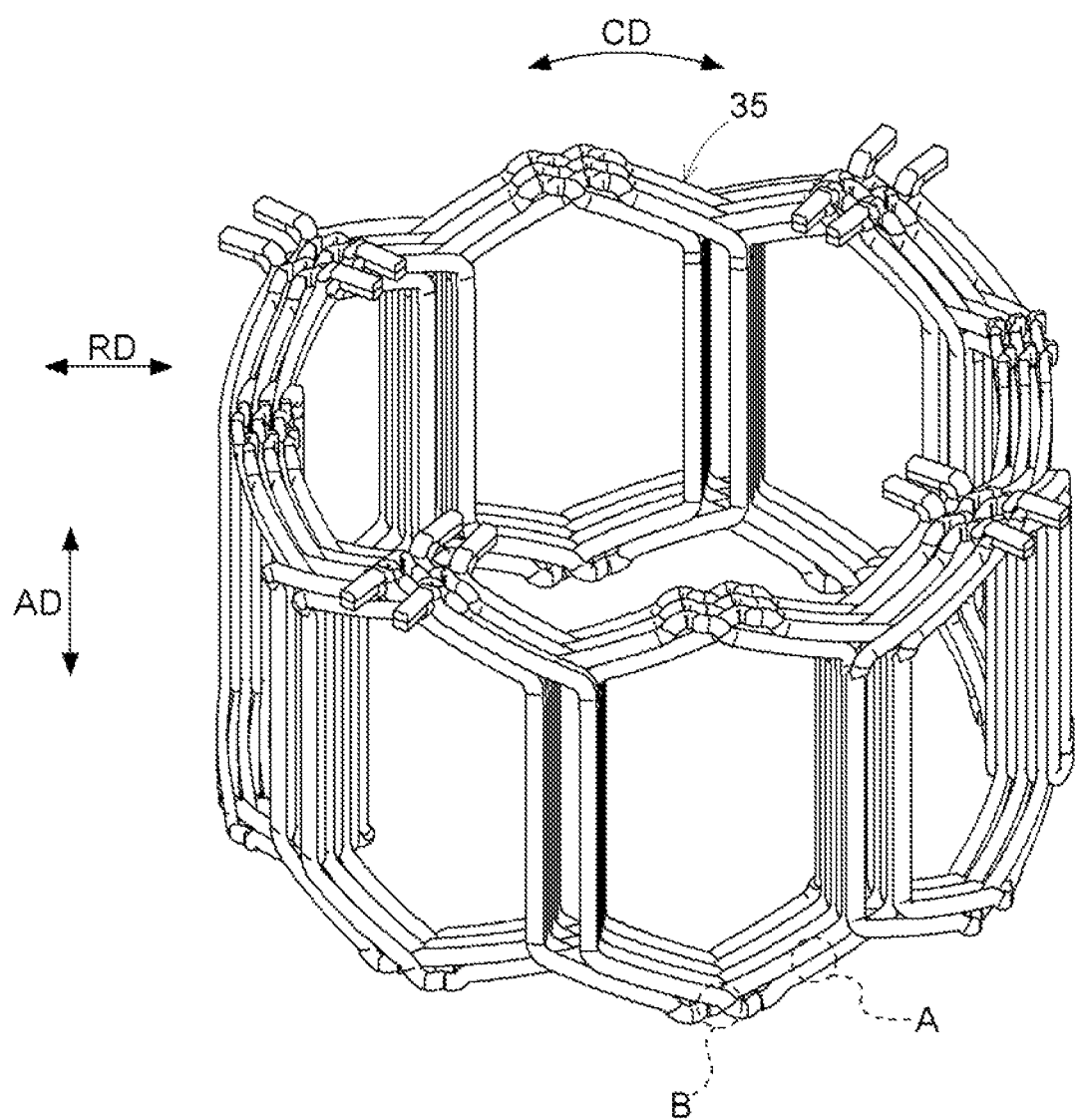
FIG. 11 is a perspective view of a coil set of one phase that is configured of two sets of concentric winding.

As illustrated in FIGS. 2 and 10, one phase is configured so that two sets of concentric winding are connected in parallel, in which each set is wound around an adjacent slot 40 and includes two systems (a set of a U1 and a U2 and a set of a U3 and a U4 in FIG. 10) connected in parallel. The set of the U1 and the U2 is configured of eight single coils (CCW1, CCW2, CCW3, CCW4, CCW5, CCW6, CCW7, and CCW8) in which each coil is wound counterclockwise (CCW) in the circumferential direction CD, for example. The set of U3 and U4 is configured of eight single coils (CW1, CW2, CW3, CW4, CW5, CW6, CW7, and CW8) in which each coil is wound clockwise (CW) in the circumferential direction CD, for example. FIG. 11 illustrates an example of a coil set of one phase that is configured of two sets of concentric winding.

In such a coil set, various cases of poor insulation may occur. For example, in a spot "A" illustrated in the perspective view in FIG. 11, poor insulation may occur between the linear conductors 35 at the same winding position of the same single coil, such as a first mode md1 and a third mode md3 illustrated in the winding diagram in FIG. 10. For example, in the first mode md1, poor insulation may occur between a first turn 1T of the "U1" and a first turn 1T of the "U2" in the first counterclockwise single coil CCW1. In the third mode md3, poor insulation may occur between a fifth turn 5T of the "U1" and a fifth turn 5T of the "U2" in the eighth counterclockwise single coil CCW8.

In a spot "B" illustrated in the perspective view in FIG. 11, poor insulation may occur between the linear conductors 35 at different winding positions of the same single coil, such as a second mode md2 and a fourth mode md4 illustrated in the winding diagram in FIG. 10. For example, in the second mode md2, poor insulation may occur between a first turn 1T of "U3" and a second turn 2T of "U4" in the first clockwise single coil CW1. In the fourth mode md4, poor insulation may occur between a fifth turn 5T of "U3" and a fourth turn 4T of "U4" in the eighth clockwise single coil CW8.

Such as the fifth mode md5 and the sixth mode md6 illustrated in the winding diagram in FIG. 10, poor insulation may occur between the linear conductors of a set of concentric winding of different systems. The fifth mode md5 is an example in which poor insulation occurs between the first turn 1T of "U2" in the first counterclockwise single coil CCW1 and the fifth turn 5T of "U3" in the first clockwise single coil CW1. The sixth mode md6 is an example in which poor insulation occurs between the first turn 1T of "U2" in the first counterclockwise single coil CCW1 and the fifth turn 5T of "U3" in the eighth clockwise single coil CW8.

Figure 12:
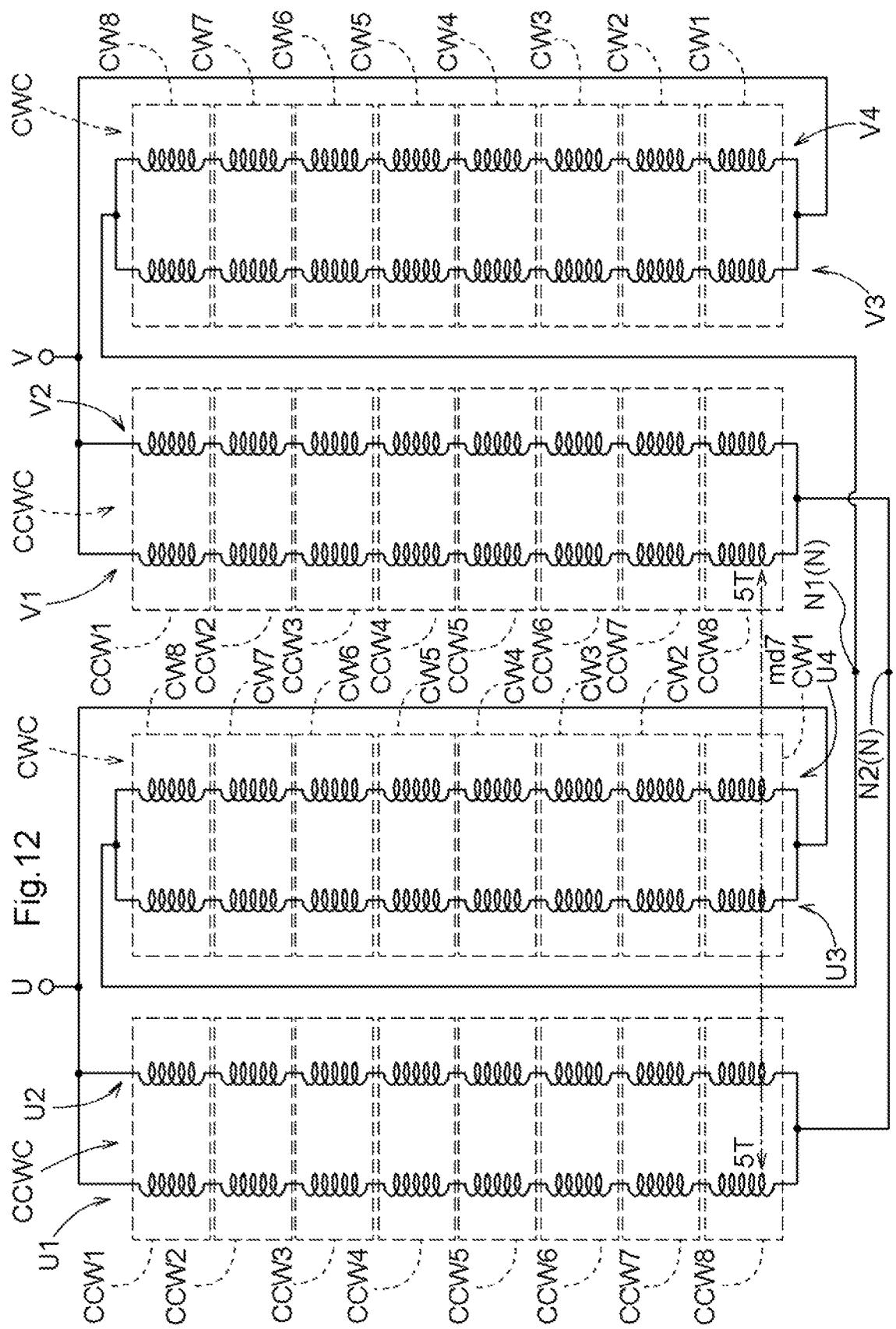
FIG. 12 is a winding diagram of the coil set of the U-phase and a coil set of a V-phase.

In FIGS. 10 and 11, poor insulation in the coils 30 of the same phase are illustrated. However, poor insulation may occur between the linear conductors 35 of different phases. FIG. 12 illustrates a winding diagram of two phases (here, the U-phase and the V-phase). As illustrated as a seventh mode md7 in FIG. 12, poor insulation may occur between the fifth turn 5T of the "U1" in the eighth counterclockwise single coil CCW8 of the U-phase and a fifth turn 5T of a "V1" in an eighth counterclockwise single coil CCW8 of the V-phase.

Poor insulation cases in the first mode md1 to the seventh mode md7 are described above. Since the spots in the first mode md1 and the third mode md3 at which poor insulation occur have the same electrical potential, even when determination of the defective product is attempted by using LC and RC that are the circuit constants as the feature amount as described above, a sufficient difference does not appear. Even when the insulation between the linear conductors 35 that have the same electrical potential deteriorates, there is hardly any effect on the electrical performance of the stator 100, for example. In an environment in which such poor insulation occurs in the coil 30 however, it is preferable, from the viewpoint of production management, to be aware of the possibility of poor insulation occurring at a spot at which the electrical performance is affected. Thus, it is preferable that poor insulation in places that have the same electrical potential be appropriately detected.

According to experiments and simulations carried out by the inventors, it is confirmed that poor insulation in such places that have the same electrical potential can be detected by using, as the feature amount (determination index), at least one of the zero cross point at which the response voltage intersects with reference voltage and the peak voltages of a positive side and a negative side of the response voltage, in addition to the circuit constant of the coil 30 such as LC and RC.

As illustrated in FIG. 8, there are zero cross points (tx1, tx2, tx3, . . . , tx13, . . . ) at a plurality of points. As illustrated in FIG. 9 that is a partially enlarged view, the phase of the good product and the phase of the defective product are out-of-phase with each other and the zero cross points are different. When distinguishing the good product and the defective product, it is preferable that a feature that differs between the good product and the defective product be extracted. As described above, the waveform of the initial response voltage is often disturbed, and it is preferable that the initial response voltage be not included in the data for determining the quality of the coil 30. For example, it is preferable that the zero cross points that are used as the feature amount (determination index) be a plurality of points at or after a second zero cross point tx2 at which the response voltage intersects with reference voltage for the second time. Similarly, it is preferable that the peak voltages of the response voltage on the positive side and the negative side that are used as the feature amount (determination index) be voltages of or after a second period of the response voltage (at or after Vp3 or Vp4 indicated in FIG. 8).

Figure 13:
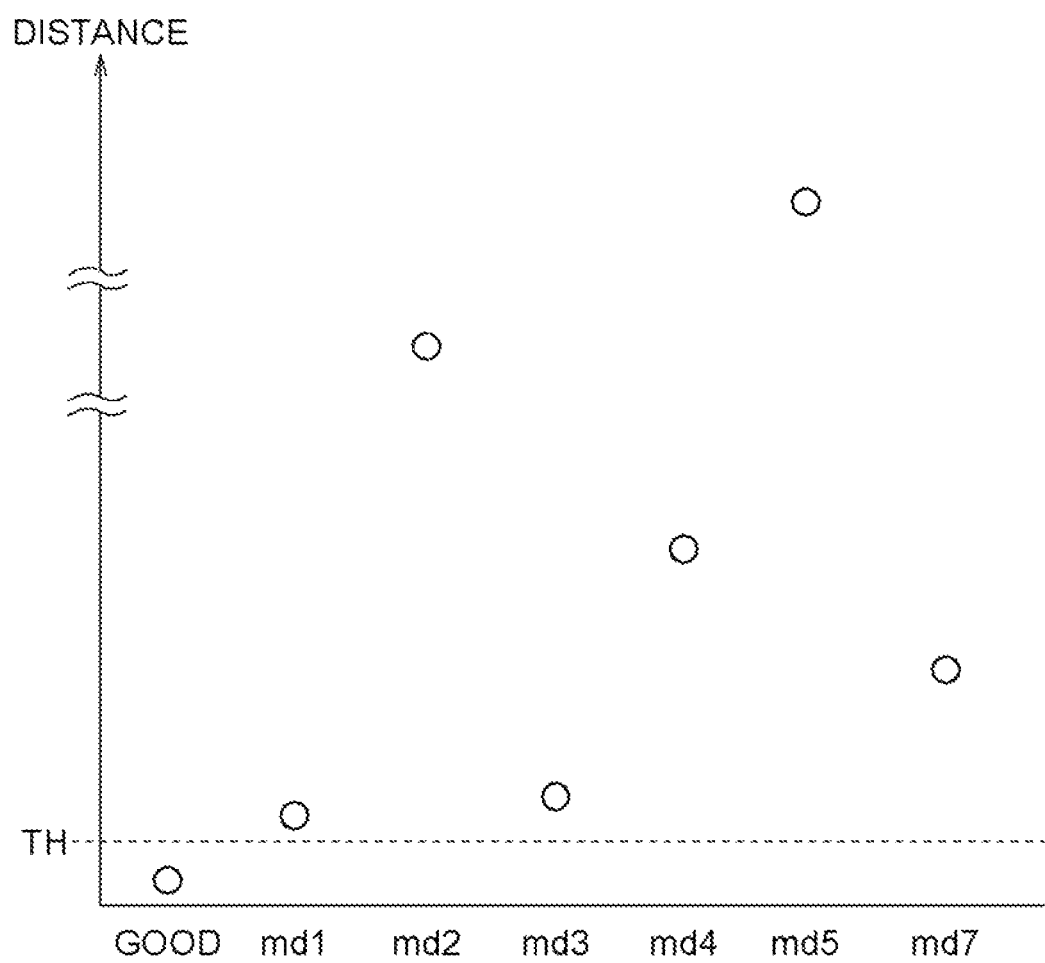
FIG. 13 is an explanatory diagram illustrating a principle of distinguishing the good product and the defective product with a multivariate analysis.

For example, the determination unit 6 performs a multivariate analysis of at least three types of feature amounts (determination indexes) of LC, RC, and the zero cross point. The determination unit 6 then determines the quality of the coil 30 based on a distance between a position of the feature amount of the reference coil in a determination coordinate space and a position of the feature amount of the target coil in the determination coordinate space. FIG. 13 illustrates a result of performing the multivariate analysis to calculate the distance serving as a quantitative value, regarding the first mode md1 to the fifth mode md5 and the seventh mode md7 described above. The Euclidean distance or the Mahalanobis distance may be used as the distance. As illustrated in FIG. 13, even in the first mode md1 and the third mode md3 in which poor insulation occurs at the same electrical potential, it is possible to distinguish from the good product by setting a threshold TH of the distance. In addition to the methods described above, the Kernel density functional method or the one class SVM may be used for the multivariate analysis of relative identification.

When an impulse voltage is applied in the sixth mode md6, a large amount of current flows due to the electrical potential difference being large, and it is not possible to observe the response voltage. The multivariate analysis is thus not performed in the sixth mode md6. In the sixth mode md6, the defect of the coil 30 is detected with overcurrent detection.

When the zero cross point is used as the feature amount, the time of each zero cross point may be used or the amount of time between two zero cross points that are prescribed may be used. In the multivariate analysis illustrated in FIG. 13, the amount of time between the second zero cross point tx2 (reference zero cross point) and a fourteenth zero cross point tx14 (determination zero cross point) is used as the feature amount. As described above with reference to FIG. 9, there is a tendency of the phase difference between the good product and the defective product becoming larger with the passage of time. It is thus preferable that one of the zero cross points be set toward the rear when the amount of time between the two zero cross points is the feature amount. It is preferable that the zero cross point toward the front side be at or after the second zero cross point tx2.

The zero cross points that are used as the feature amount (determination index) are a plurality of points at or after the second zero cross point tx2 at which the response voltage intersects with reference voltage for the second time. When the amount of time between the two zero cross points is used as the feature amount, the zero cross points at the plurality of points include a reference zero cross point that is set at a zero cross point at or after the second zero cross point tx2 and a determination zero cross point that is set at a zero cross point at or after the reference zero cross point. The feature amount (determination index) is the amount of time from the reference zero cross point to the determination zero cross point. In the example described above with reference to FIGS. 8 and 13, the second zero cross point tx2 is the reference zero cross point and the fourteenth zero cross point tx14 is the determination zero cross point.

If the amount of time from the reference zero cross point to the determination zero cross point is short, the difference between the reference coil and the target coil does not easily appear. It is preferable that at least one zero cross point is included as an intermediate zero cross point between the reference zero cross point and the determination zero cross point. In the example described above with reference to FIG. 8, eleven zero cross points from the third zero cross point tx3 to the thirteenth zero cross point tx13 can be regarded as the intermediate zero cross points.

As described above, the waveform of the initial response voltage is often disturbed. Thus, it is preferable that the initial response voltage be not included in the data for determining the quality of the coil 30. The oscillating response voltage becomes nearly stable past the first peak point in the positive direction or the negative direction (first peak point tp1, first plus peak point tpp1 in the embodiment) and further past the first zero cross point tx1 at which the response voltage intersects with the reference voltage for the first time. It is thus preferable that the quality of the coil 30 be determined by using a zero cross point (zero cross point at or after the second zero cross point tx2) at or after the peak point in the positive direction or the negative direction (second peak point tp2, first minus peak point tnp1 in the embodiment) that is immediately after the first peak point tx1.

For example, in the form illustrated in FIG. 13, the zero cross points used as the feature amount are at the plurality of points (second zero cross point tx2 and fourteenth zero cross point tx14) at or after the second zero cross point at which the response voltage intersects with reference voltage for the second time. According to experiments as simulations carried out by the inventors, the determination accuracy is higher when the second zero cross point tx2 and the fourteenth zero cross point tx14 are used compared to when the first zero cross point tx1 and the fourteenth zero cross point tx14 are used. It can be assumed that it is preferable that two points at or after the second zero cross point tx2 be used. It is thus preferable that the zero cross point be set based on an inspection time and an amount of data that can be stored in the diagnostic device 1 etc.

In the above description, the zero cross point is set as the feature amount in addition to the circuit constants (LC, RC) of the coil 30. However, there is a difference in the amplitude of the voltage between the good product and the defective product, as illustrated in FIG. 9. The peak voltage on the positive side and the negative side of the response voltage may be set as the feature amount in addition to the circuit constants (LC, RC) of the coil 30. As described above, similar to the case in which the zero cross point is used as the feature amount (determination index), it is preferable that the peak voltage on the positive side and the negative side of the response voltage be a voltage at a peak point of or after the second period of the response voltage (a peak voltage that appears at or after a third peak voltage vp3 (second plus peak vpp2) of a third peak point tp3 (second plus peak point tpp2) or a fourth peak voltage vp4 (second minus peak voltage vnp2) of a fourth peak point tp4 (second minus peak point tnp2) illustrated in FIG. 8). It is preferable that the peak voltage used as the feature amount be any one or more points from a fifth minus peak point tnp5 to an eighth plus peak point tpp8 (tnp5, tpp6, tnp6, tpp7, tnp7, and tpp8) included in the second period T2 in FIG. 9, for example.

"The voltage of the peak point of or after the second period" is "the voltage of the peak point at or after passing at least two peak points". There is "a first period" before "the second period" and there are at least two peak points in "the first period". Since the third peak point is a peak point in "the second period", "the voltage of the peak point of or after the second period" is "the voltage of the peak point at or after passing at least two peak points". In the example illustrated in FIG. 8, the first peak point tp1 (first plus peak point tpp1) and the second peak point tp2 (first minus peak point tnp1) are the peak points of "the first period". The third peak point tp3 (second plus peak point tpp2) and the fourth peak point tp4 (second minus peak point tnp2) are the peak points of "the second period". The peak points of or after the second period are peak points at or after the third peak point tp3 (second plus peak point tpp2).

A multivariate analysis may be performed on four feature amounts with the zero cross point and the peak voltage serving as the feature amounts in addition to the circuit constants (LC, RC) of the coil 30. When performing the multivariate analysis using the four feature amounts, the four feature amounts including the amount of time between the second zero cross point tx2 and the fourteenth zero cross point tx14 and the amount of time between the first zero cross point tx1 and the fourteenth zero cross point tx14, in addition to the circuit constants (LC, RC) of the coil 30 may be used. Five feature amounts including the peak voltage, the amount of time between the second zero cross point tx2 and the fourteenth zero cross point tx14, the amount of time between the first zero cross point tx1 and the fourteenth zero cross point tx14 in addition to the circuit constants (LC, RC) of the coil 30 may be used.

It is preferable that the circuit constants (LC, RC) of the coil 30 be derived by performing calculation based on the response voltage, the derivative voltage, and the integral voltage as described above. However, calculation may be performed based on the response voltage, the derivative voltage, and the second order derivative voltage.

The usefulness of using, as the feature amount (determination index), the zero cross point and the peak voltage on the positive side and the negative side of the response voltage is described above. Hereinafter, experiments and simulations carried out by the inventors will be described.

Figure 14:
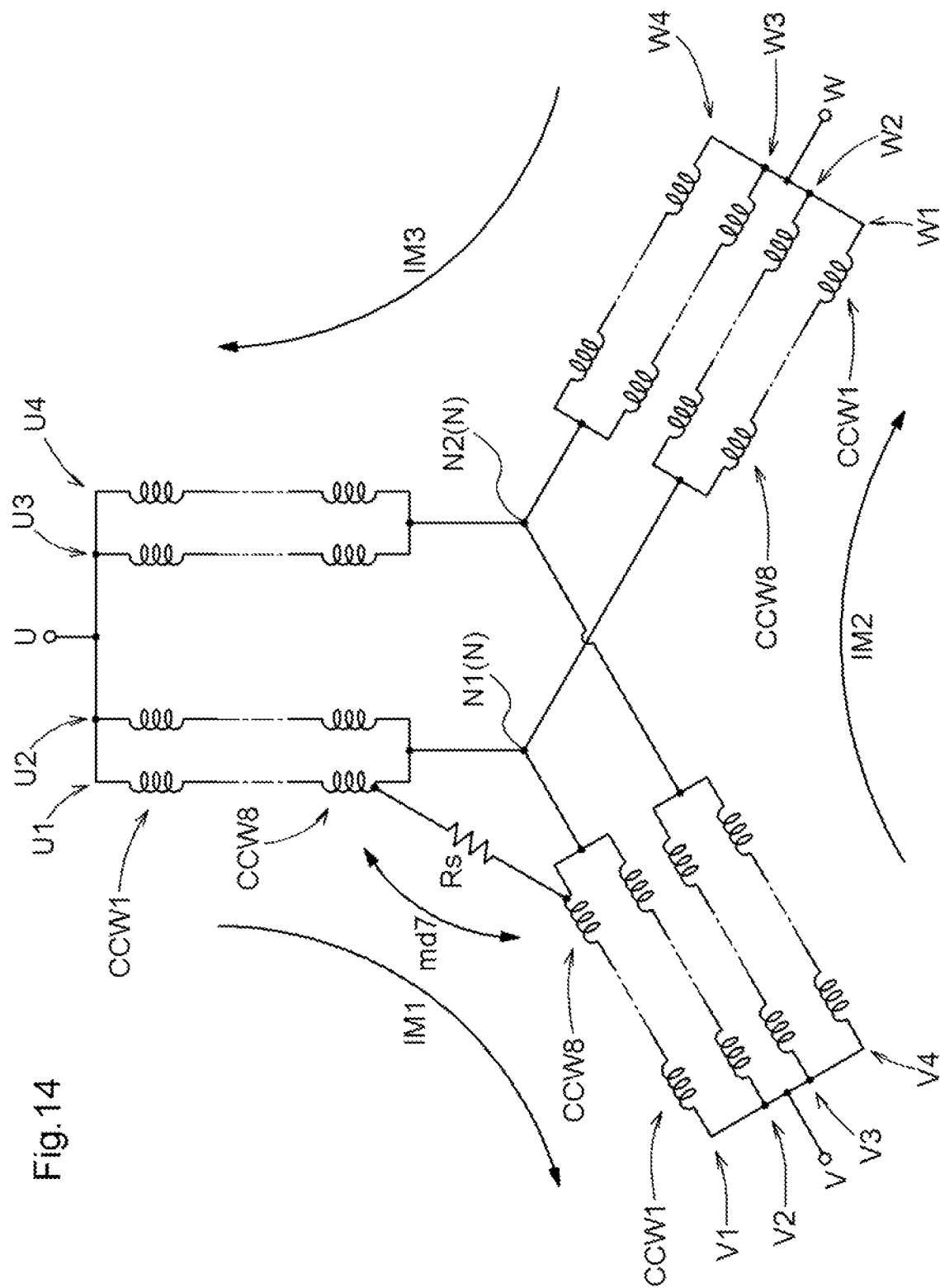
FIG. 14 is an explanatory diagram illustrating a model of poor insulation (short circuit) and directions in which an impulse voltage is applied.

FIG. 14 illustrates a poor insulation model (short circuit model) and directions in which the impulse voltage is applied, with respect to experiment results and simulation results described below. Here, poor insulation (short circuit) of the seventh mode md7 as described with reference to FIG. 12 is modeled. That is, the case in which a short circuit occurs between the eighth counterclockwise single coil CCW8 of the U-phase (U1) and the eighth counterclockwise single coil CCW8 of the V-phase (V1) is modeled. The sign "Rs" indicates a short circuit resistance when a short circuit occurs. Here, when the short circuit resistance Rs is nearly zero, it is called a "dead short circuit". Nearly zero indicates that a resistance of the short circuit resistance Rs is less than a short circuit threshold. It is preferable that the short circuit threshold be less than an impedance (resistance) of the single coil (for example, less than 10 [mΩ]). When the short circuit resistance Rs is equal to or more than the short circuit threshold, for example when the short circuit resistance Rs is equal to or more than 10 [mΩ], it is called a "resistance short circuit". Hereinafter, the results of experiments and simulations will be described, in which the experiments and the simulations were carried out by setting the short circuit resistance Rs on the basis of "Rs=0" in the case of a dead short circuit and by setting the short circuit resistance Rs as various values on the basis of "RS>0" in the case of a resistance short circuit.

Figure 15:
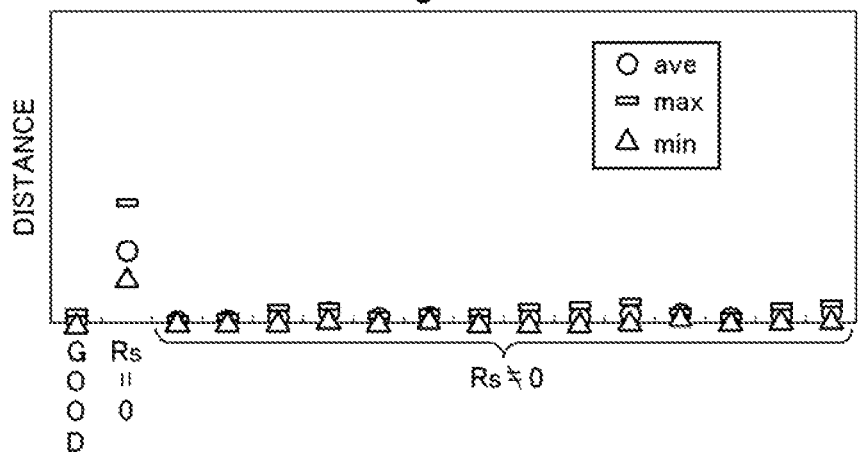
FIG. 15 is a diagram illustrating a determinability of the good product and the defective product by LC and RC when impulse voltage is applied between the U-phase and the V-phase.
Figure 16:
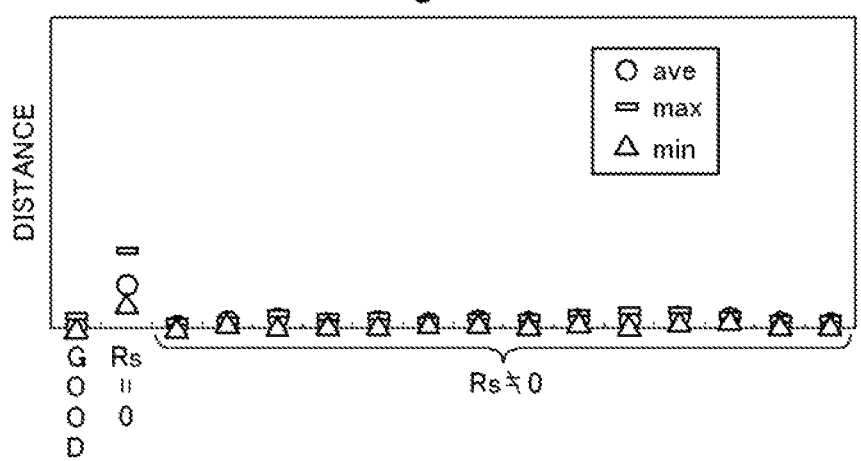
FIG. 16 is a diagram illustrating a determinability of the good product and the defective product by LC and RC when impulse voltage is applied between the V-phase and the W-phase.
Figure 17:
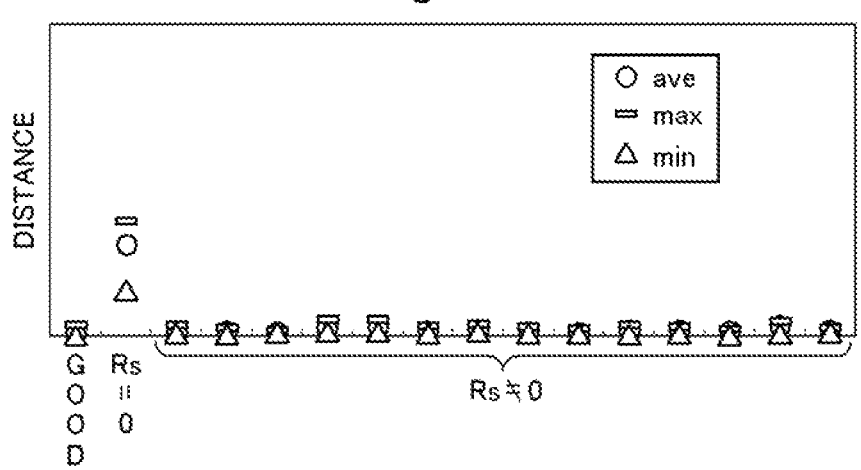
FIG. 17 is a diagram illustrating a determinability of the good product and the defective product by LC and RC when impulse voltage is applied between the W-phase and the U-phase.

The impulse test using the diagnostic device 1 is described above with reference to FIG. 2. As illustrated in FIG. 14, when diagnosing the coil 30, the impulse voltage is applied between phases, that is, between U-phase and V-phase (IM1), between V-phase and W-phase (IM2), and between W-phase and U-phase (IM3). FIGS. 15 and 16 illustrate the distances of the good product and the defective product in the case in which LC and RC when the impulse voltage is applied are set as the feature amounts. The distance is the Euclidean distance or the Mahalanobis distance as described above. FIGS. 15, 16, and 17 illustrate the distances when the impulse voltage is applied between U-phase and V-phase, between V-phase and W-phase, and between W-phase and U-phase, respectively. Here, fourteen variations of resistance are used as the short circuit resistance Rs. The resistance is smaller towards the left side (for example, 100 [mΩ]) and the resistance is larger towards the right side (for example, 10 [Ω]) of the lateral axis.

As it is clear in FIGS. 15 to 17, when a dead short circuit occurs, the distance differs from that of the good product, and it is possible to distinguish the defective product by setting an appropriate threshold. However, when a resistance short circuit occurs, there is no clear difference between the distances of the good product and the defective product, and it is difficult to distinguish the defective product regardless of between which phases the impulse voltage is applied. As described above, there is a limit to the diagnosis when LC and RC are set as the feature amounts (determination indexes).

Figure 18:
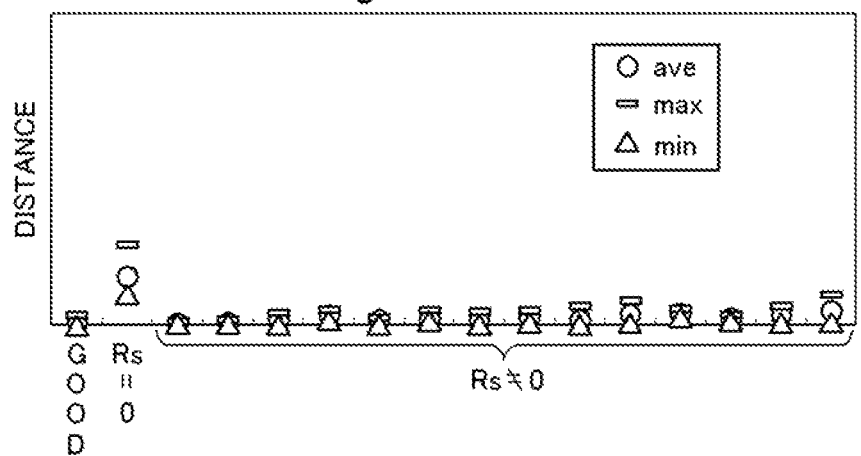
FIG. 18 is a diagram illustrating a determinability of the good product and the defective product by LC, RC, and a zero cross time when impulse voltage is applied between the U-phase and the V-phase.
Figure 19:
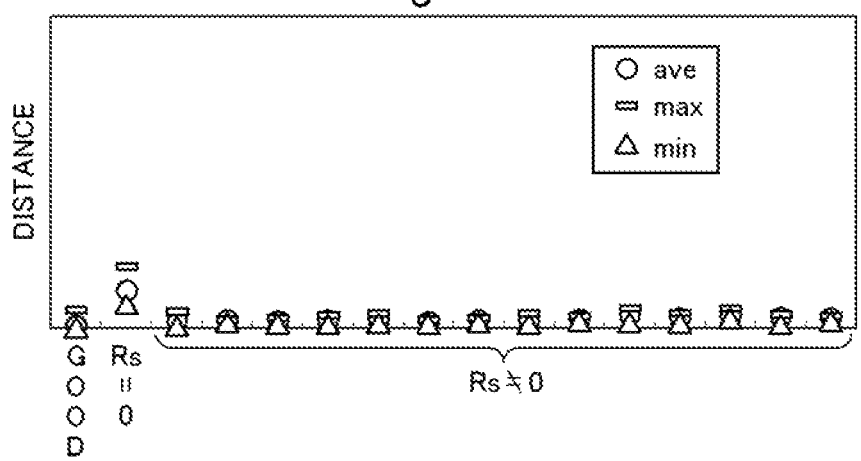
FIG. 19 is a diagram illustrating a determinability of the good product and the defective product by LC, RC, and the zero cross time when impulse voltage is applied between the V-phase and the W-phase.
Figure 20:
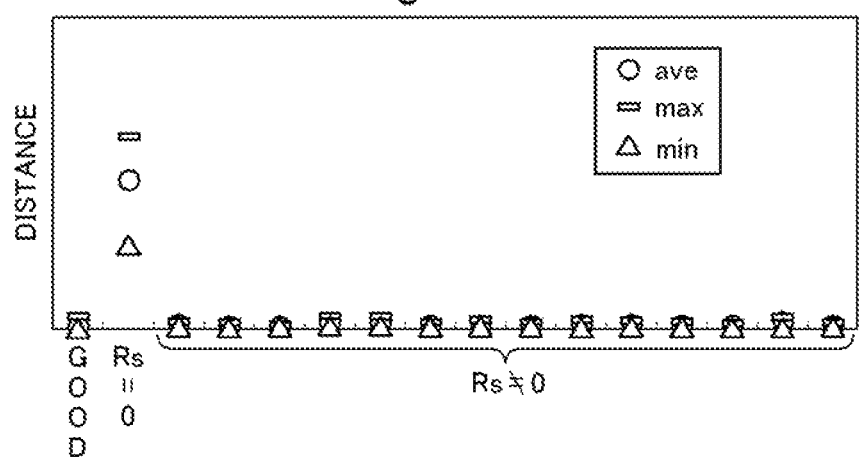
FIG. 20 is a diagram illustrating a determinability of the good product and the defective product by LC, RC, and the zero cross time when impulse voltage is applied between the W-phase and the U-phase.

FIGS. 18 to 20 illustrate the distances of the good product and the defective product when LC, RC, and a zero cross time are set as the feature amounts. FIGS. 18, 19, and 20 illustrate the distances when the impulse voltage is applied between U-phase and V-phase, between V-phase and W-phase, and between W-phase and U-phase, respectively. The lateral axes in FIGS. 18 to 20 are the same as the lateral axes in FIGS. 15 to 17. In this case, when a dead short circuit occurs, the distance differs from that of the good product, and it is possible to distinguish the defective product by setting an appropriate threshold. However, when a resistance short circuit occurs, there is no clear difference between the distances of the good product and the defective product, and it is difficult to distinguish the defective product regardless of between which phases the impulse voltage is applied.

Figure 21:
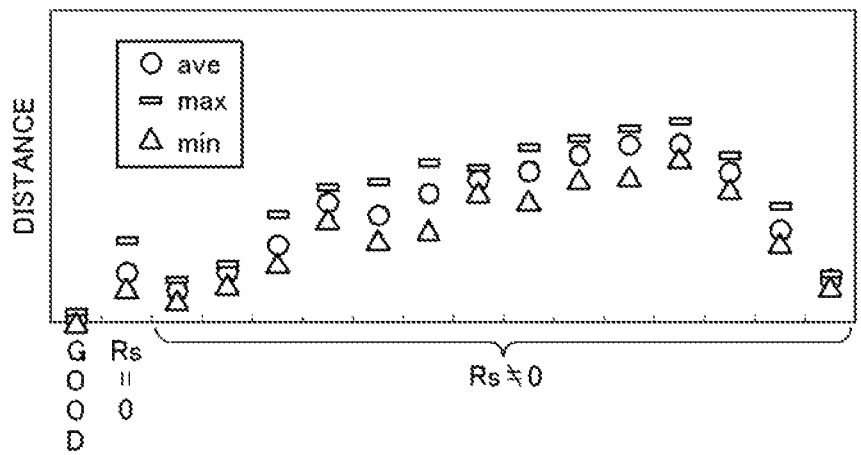
FIG. 21 is a diagram illustrating a determinability of the good product and the defective product by LC, RC, and a peak voltage when impulse voltage is applied between the U-phase and the V-phase.
Figure 22:
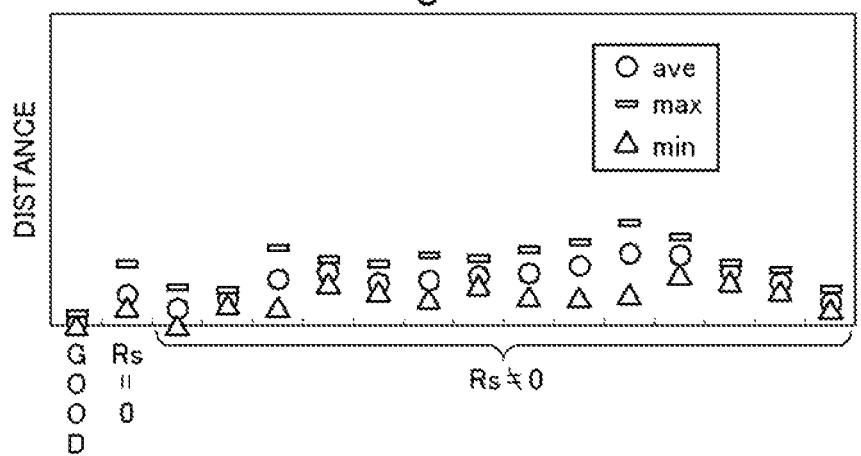
FIG. 22 is a diagram illustrating a determinability of the good product and the defective product by LC, RC, and the peak voltage when impulse voltage is applied between the V-phase and the W-phase.
Figure 23:
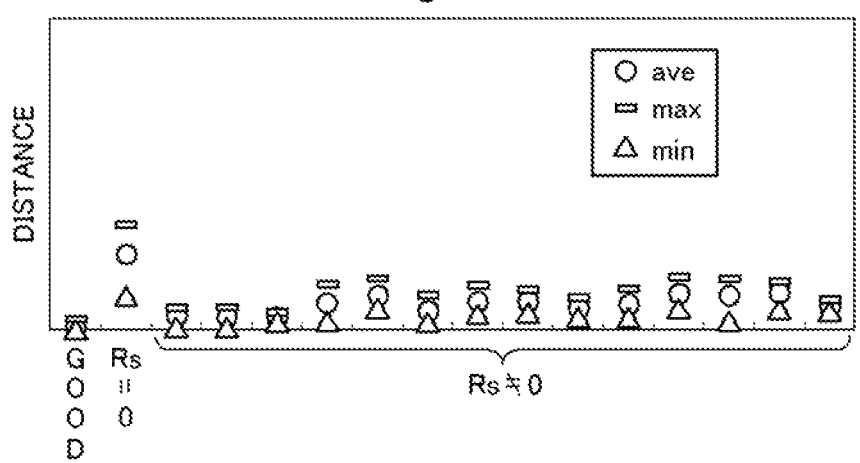
FIG. 23 is a diagram illustrating a determinability of the good product and the defective product by LC, RC, and the peak voltage when impulse voltage is applied between the W-phase and the U-phase.

FIGS. 21 to 23 illustrate the distance of the good product and the defective product when LC, RC, and the peak voltage are the feature amounts. Here, the peak voltage at an eighth period indicated by "E8" in FIG. 8. FIGS. 21, 22, and 23 illustrate the distances when the impulse voltage is applied between U-phase and V-phase, between V-phase and W-phase, and between W-phase and U-phase, respectively. The lateral axes in FIGS. 21 to 23 are the same as the lateral axes in FIGS. 15 to 21. As illustrated in FIG. 21, when the impulse voltage is applied between the U-phase and V-phase and LC, RC, and the peak voltage are set as the feature amounts, the distance differs from that of the good product when a dead short circuit occurs and when a resistance short circuit occurs. It is thus possible to distinguish the defective product by setting an appropriate threshold.

When the impulse voltage is applied between the V-phase and W-phase, the difference between the distances of the good product and the defective product is smaller, compared to when the impulse voltage is applied between U-phase and V-phase, as illustrated in FIG. 22. However, since the distance is different from the good product when a dead short circuit occurs and when a resistance short circuit occurs, it is possible to distinguish the defective product by setting an appropriate threshold.

When the impulse voltage is applied between the W-phase and U-phase, the distance differs from that of the good product when a dead short circuit occurs. When a resistance short circuit occurs, there is no clear difference in the distances of the good product and the defective product. When the impulse voltage is applied between the W-phase and U-phase, the defective product can be distinguished when a dead short circuit occurs but the defective product cannot be easily distinguished when a resistance short circuit occurs. However, while diagnosis is being performed, the impulse voltage is applied between phases, that is, between U-phase and V-phase (IM1), between V-phase and W-phase (IM2), and between W-phase and U-phase (IM3) in order, so that it is possible to distinguish the defective product at one of the phases.

As described above with reference to FIGS. 18 to 20, when the abnormality of the target coil is a dead short circuit, the determination unit 6 is able to appropriately determine whether there is an abnormality in the target coil by setting the zero cross point as the determination index. As illustrated above with reference to FIGS. 21 to 23, when the abnormality of the target coil is a resistance short circuit, the determination unit 6 is able to appropriately determine whether there is an abnormality in the target coil by setting the peak voltage as the determination index.

Figure 24:
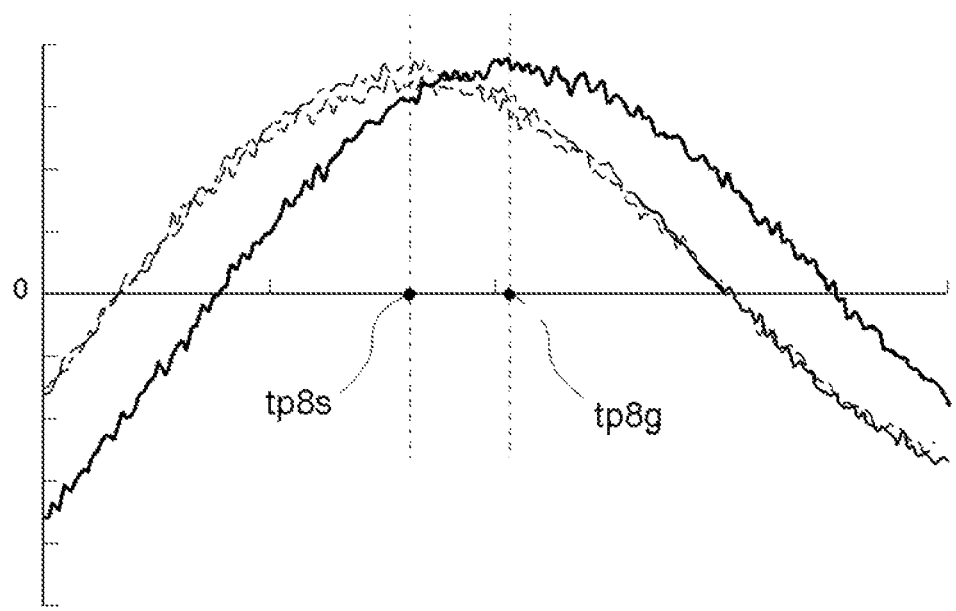
FIG. 24 is a waveform chart illustrating a difference in the zero cross points of the good product and the defective product.

A waveform chart in FIG. 24 illustrates the difference of the zero cross points of the good product and the defective product in the eighth period (E8) of the response voltage in FIG. 8. The solid line indicates the response voltage of the good product and the other two lines indicate the response voltage of the target coil in a dead short circuit state. As illustrated in FIG. 24, a zero cross point "tp8s" of the response voltage of the target coil in the dead short circuit state is at an earlier time compared to a zero cross point "tp8g" of the response voltage of the good product. The determination unit 6 is thus able to appropriately determine whether there is an abnormality in the target coil by setting the zero cross point as the determination index when the abnormality of the target coil is a dead short circuit.

Figure 25:
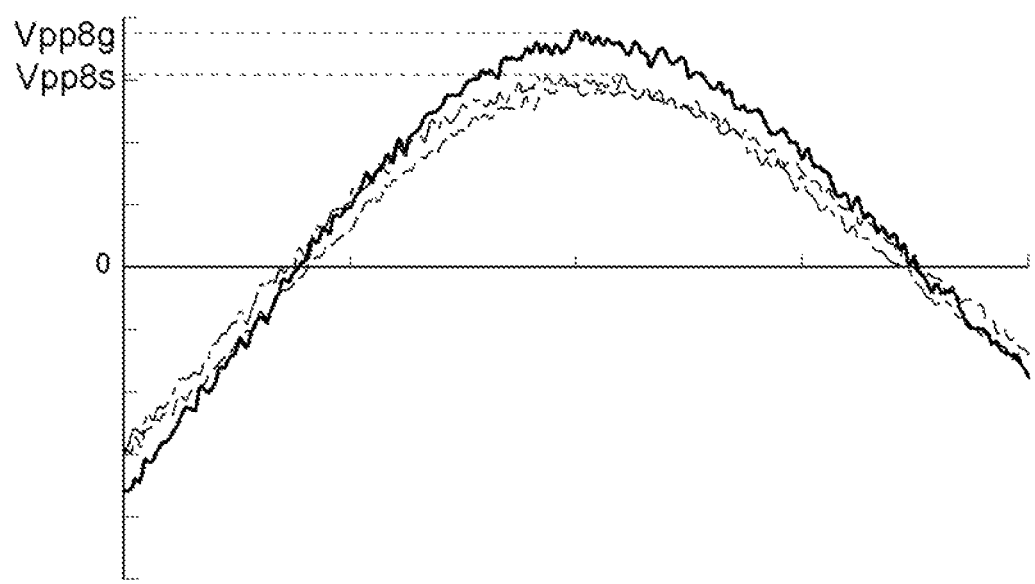
FIG. 25 is a waveform chart illustrating a difference in the peak voltages of the good product and the defective product.

A waveform chart in FIG. 25 illustrates the difference between the peak voltages of the good product and the defective product in the eighth period (E8) of the response voltage indicated in FIG. 8. The solid line indicates the response voltage of the good product and the other two lines indicate the response voltage of the target coil in a resistance short circuit state. As illustrated in FIG. 25, a peak voltage "Vpp8s" of the response voltage of the target coil in the resistance short circuit state is a lower voltage compared to a peak voltage "Vpp8s" of the response voltage of the good product. The determination unit 6 is thus able to appropriately determine whether there is an abnormality in the target coil by setting the peak voltage as the determination index when the abnormality of the target coil is a resistance short circuit.

Figure 26:
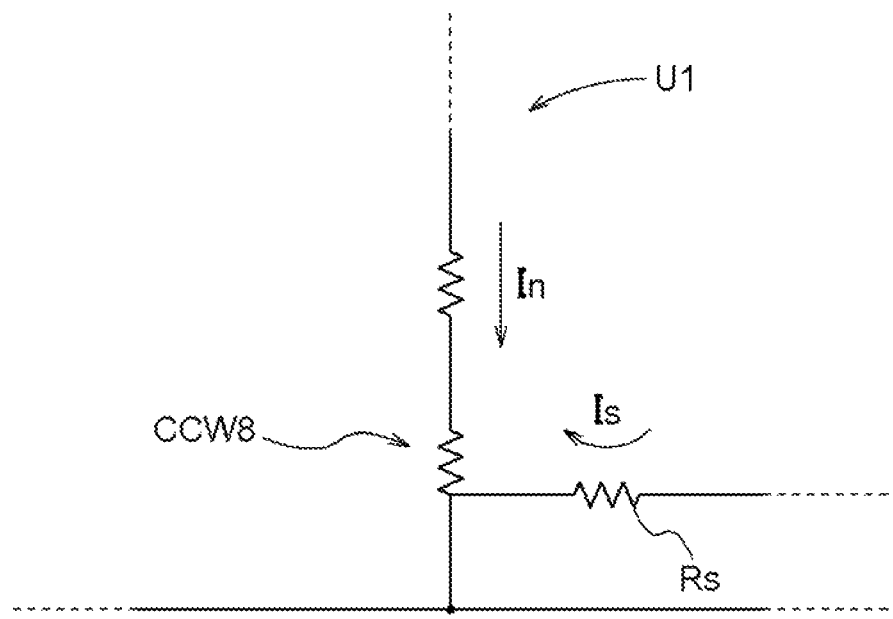
FIG. 26 is an estimation principle diagram of a resistance short circuit.

FIG. 26 illustrates an estimation principle diagram of a resistance short circuit. Specifically, FIG. 26 illustrates an example of when a resistance short circuit occurs in the eighth counterclockwise single coil CCW8 of the first system (U1) of the U-phase. Here, the resistance component of the coil 30 is indicated as an equivalent circuit. In this case, a short circuit current Is that flows in the reverse direction of a phase current In flowing in the U-phase (U1) flows from another place that is connected by a resistance short circuit, so that the phase current In is hindered. As a result, the speed of the current (time derivative of the current) "di(t)/dt" of the coil 30 in which a resistance short circuit occurs is small compared to that of the good product. A voltage drop "e(t)" in the coil 30 including the inductance L is indicated by a product of the speed of the current and the inductance L.

That is, "e(t)=L(di(t)/dt)". Since the speed of the current "di(t)/dt" of the coil 30 in which a resistance short circuit occurs is small compared to that of the good product, the voltage drop "e(t)" in the coil 30 in which a resistance short circuit occurs is also small compared to that of the good product.

Figure 27:
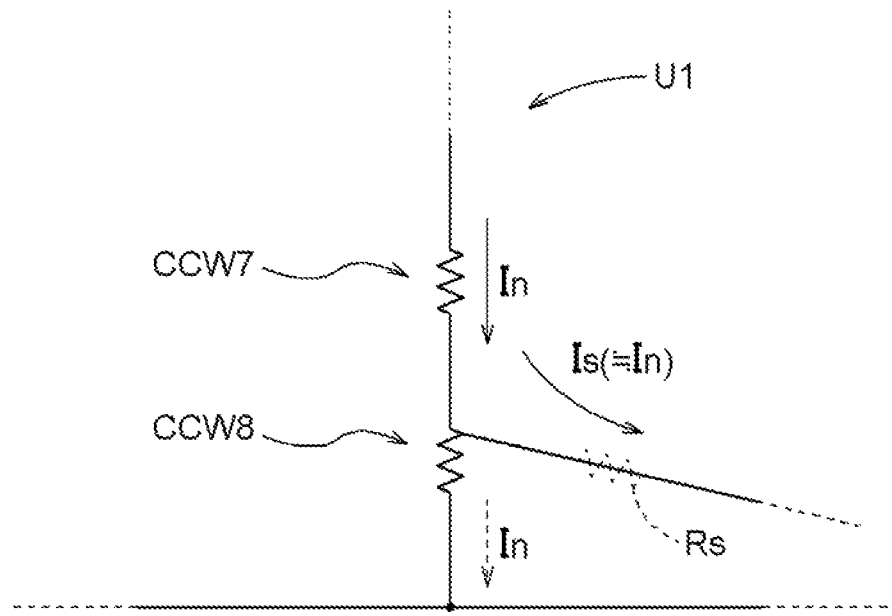
FIG. 27 is an estimation principle diagram of a dead short circuit.

FIG. 27 illustrates an estimation principle diagram of a dead short circuit. Specifically, FIG. 27 illustrates an example of when a dead short circuit occurs in the eighth counterclockwise single coil CCW8 of the first system (U1) of the U-phase. As described above, the impedance (resistance of the short circuit resistance Rs) at the point at which a dead short circuit occurs is smaller than the impedance of the single coil. It thus becomes difficult for the phase current In to flow through the eighth counterclockwise single coil CCW8 that has a larger impedance compared to a point at which short circuit occurs. As a result, the number of single coils in the first system (U1) of the U-phase decreases, and the inductance L of the coil 30 in which a dead short circuit occurs becomes small compared to the good product. A resonance frequency "fc" indicated by the following formula (5) thus becomes high.

$$fc=1/(2\pi \cdot ((LC)(\tfrac{1}{2}))) \qquad (5)$$

As the resonance frequency fc becomes higher, the period of the response voltage becomes shorter, so that the zero cross point appears earlier.

Summary of Embodiments

Hereinafter, a summary of the diagnostic device (1) for the coil described above will be described simply.

As one aspect, the diagnostic device (1) for the coil includes:

the voltage application unit (2) that applies the impulse voltage to the coil (30);

the response voltage detection unit (3) that detects the response voltage from the coil (30) with respect to the impulse voltage;

the index calculation unit (5) that calculates the determination index indicating the electrical feature of the coil based on the response voltage; and the determination unit (6) that determines whether there is an abnormality in the target coil that is the coil (30) to be diagnosed by comparing the determination index of the reference coil that is the coil (30) that is normal and the determination index of the target coil, in which at least one of the zero cross point at which the response voltage intersects with the reference voltage that is prescribed, and the peak voltage on a positive side and a negative side of the response voltage is used as the determination index, in addition to the circuit constant of the coil (30).

The technical features of the diagnostic device (1) for the coil can be applied to a diagnostic method for a coil. For example, the diagnostic method for the coil can contain various steps including the features of the diagnostic device (1) for the coil described above. As a matter of course, the diagnostic method for the coil can accomplish the operation and the effects of the diagnostic device (1) for the coil described above.

The diagnostic method for the coil in this case includes as an aspect:

the voltage applying step (#2) of applying the impulse voltage to the coil (30);

the response voltage detection step (#3) of detecting the response voltage from the coil (30) with respect to the impulse voltage;

the index calculation step (#5) of calculating the determination index indicating the electrical feature of the coil based on the response voltage; and the determination step (#6) of determining whether there is an abnormality in the target coil that is the coil (30) to be diagnosed by comparing the determination index of the reference coil that is the coil (30) that is normal and the determination index of the target coil, in which at least one of the zero cross point at which the response voltage intersects with the reference voltage that is prescribed, and the peak voltage on a positive side and a negative side of the response voltage is used as the determination index, in addition to the circuit constant of the coil (30).

Decrease in insulation between conductors that form the coil is an example of an abnormality of the coil to be diagnosed. Even when insulation between the conductors of the same electrical potential deteriorates in the coil (30), the effect on the electrical performance is low. Thus, the effect of the circuit constant of the coil (30) as the determination index decreases. According to experiments and simulations carried out by the inventors, it is confirmed that when the insulation between the conductors in the coil (30) that have the same electrical potential deteriorates, change is observed in the zero cross point at which the response voltage intersects with the reference voltage and in the peak voltage on the positive side or the negative side of the response voltage. That is, when at least one of the zero cross point at which the response voltage intersects with the reference voltage and the peak voltage on the positive side or the negative side of the response voltage is used in addition to the circuit constant of the coil (30), it is possible to appropriately detect the decrease in insulation between the conductors in the coil that have the same electrical potential and the decrease in insulation between the conductors in the coil that have different electrical potential. With the configuration described above, it is possible to diagnose the quality of the coil (30) in a larger target range of the coil (30) based on the response voltage acquired by applying the impulse voltage.

Here, it is preferable that the circuit constant of the coil (30) includes the product (LC) of the inductance (L) of the coil (30) and the interline capacitance (C) of the coil (30), and the product (RC) of the resistance (R) of the coil (30) and the interline capacitance (C).

The circuit constant of the coil (30) includes for example, the inductance (L) of the coil (30), the resistance (R) of the coil (30), the interline capacitance (L) of the coil (30), and the product of the above components (LC, RC, LR). When deriving a circuit constant independent from the response to an electrical stimulation to the coil (30), such as applying an impulse voltage, the calculation often becomes complicated. In contrast, since the product of the independent circuit constants can be regarded as a combined impedance of the coil (30), the product is more easily derived from the response to an electrical stimulation, compared to when the independent circuit constant is derived. The accuracy of the combined impedance (product of circuit constants) that is derived tends to be improved, based on the relationship between the combined impedance and the response voltage. It is thus preferable that the determination index includes the product (LC) of the inductance (L) and the interline capacitance (C) and the product (RC) of the resistance (R) and the interline capacitance (C).

It is also preferable that the reference voltage be zero volts.

When the reference voltage is zero volts, calculation can be easily performed. The reference voltage serving as the reference of the zero cross point is approximately the amplitude center of the response voltage and corresponds to the position of the inflection point at the amplitude central portion of the response voltage. When the response voltage does not include a direct current component (offset voltage), the reference voltage can be regarded as zero volts. Since the direct current component can be removed by using a coupling capacitor etc., the reference voltage can be set to zero volts with a simple configuration.

Here, it is preferable that the zero cross point be a plurality of points at or after the second zero cross point (tx2) at which the response voltage intersects with the reference voltage for a second time.

For example, the voltage application unit (2) applies the impulse voltage by discharging the electrical charge stored in the capacitor (2c) to the coil (30) all at once via the switch (2d). At this time, since a large amount of electric current flows through the switch (2d), the switch (2d) may be configured by connecting a plurality of switching elements in parallel. Since there may be a slight time difference when the switching elements are switched, the waveform may be disturbed in the initial response voltage. Even when the switch (2d) is configured of a single switching element, the waveform of the initial response voltage may be disturbed due to the generation of chattering etc. Thus, it is preferable that the initial response voltage be not included in the data for determining the quality of the coil (30). The oscillating response voltage becomes nearly stable past the first peak point (tp1) in the positive direction or the negative direction and further past the first zero cross point (tx1) at which the response voltage intersects with the reference voltage for the first time. It is preferable that the quality of the coil (30) be determined by using the zero cross point (zero cross point at or after the second zero cross point (tx2)) at or after the peak point (tp2) in the positive direction or the negative direction that is immediately after the first zero cross point (tx1).

It is preferable that the zero cross point at the plurality of points include the reference zero cross point that is set at the zero cross point at or after the second zero cross point (tx2) and a determination zero cross point that is set at the zero cross point at or after the reference zero cross point. It is also preferable that the determination index be the amount of time from the reference zero cross point to the determination zero cross point.

According to experiments and simulations carried out by the inventors, it is confirmed that there is a phase difference in the response voltages between the good product and the defective product. The phase difference affects the period of the response voltage and the period (including a half cycle and a sum of a plurality of cycles) can be calculated with the amount of time between different zero cross points. With the configuration, it is thus possible to appropriately diagnose the quality of the coil (30).

It is preferable that at least one zero cross point be included as the intermediate zero cross point between the reference zero cross point and the determination zero cross point.

According to experiments and simulation carried out by the inventors, it is confirmed that the phase difference between the good product and the defective product tends to increase as time passes. When the amount of time between two zero cross points are set as the determination index, it is preferable that one zero cross point be set toward the rear.

That is, rather than the reference zero cross point and the determination zero cross point being adjacent zero cross points, it is preferable that the reference zero cross point and the determination zero cross point be set including another zero cross point (intermediate zero cross point).

Here, it is preferable that the peak voltage be a voltage of the response voltage of or after the second period.

In the voltage of the response voltage of the first period, there is a possibility that the voltage is not stable, such as a distortion being generated, due to the configuration of the diagnostic device (1) such as the voltage application unit (2) that applies the impulse voltage and the response voltage detection unit (3) that detects the response voltage. For example, the voltage application unit (2) is often configured by connecting switching elements in parallel. When there is a slight time difference when the switching elements are switched, the waveform may be disturbed in the initial response voltage. The reliability of the diagnosis is thus improved by using the peak voltage on or after the second period in which the voltage is more stable, instead of the initial response voltage, for determining the quality of the coil (30).

Here, it is preferable that the abnormality of the target coil include poor insulation between the conductors (35) that configure the target coil.

Abnormalities of the target coil include disconnection, short circuiting to the ground, and poor insulation between the conductors (35) that configure the coil (30). Disconnection and short circuiting to the ground can be detected relatively clearly with other testing methods. Although the resistance between the conductors change in poor insulation between the conductors (35), it is difficult to make a distinction from the measurement error, when the resistance is measured, for example. However, it is possible to detect the change in the resistance resulting from poor insulation by using the response voltage to the applied impulse voltage. Thus, it is preferable that poor insulation of the conductors (35) that configure the coil (30) is included in the abnormality of the target coil that is diagnosed by the diagnostic device (1) for the coil.

Here, the determination unit determines whether there is an abnormality in the target coil in a manner that: the zero cross point is set as the determination index, when the abnormality of the target coil is a dead short circuit in which the target coil short circuits at the resistance less than the short circuit threshold that is prescribed; and the peak voltage is set as the determination index, when an abnormality of the target coil is a resistance short circuit in which the target coil short circuits at the resistance equal to or more than the short circuit threshold.

According to experiments and simulation carried out by the inventors, in the case of a dead short circuit, it is confirmed that the difference between the good product and the coil with the abnormality is clear when the zero cross point is set as the determination index. In the case of a resistance short circuit, it is confirmed that the difference between the good product and the coil with the abnormality is clear when the peak voltage is set as the determination index. That is, it is possible to diagnose an abnormality of the target coil including various kinds of short circuit by using theses determination indexes appropriately.

It is preferable that the determination unit (6) perform a multivariate analysis of at least three types of determination indexes, and perform determination based on the distance between the position in the determination coordinate space of the determination index of the reference coil and a position in the determination coordinate space of the determination index of the target coil.

In the multivariate analysis, an event indicated by a plurality of parameters can be indicated quantitatively, and is suitable for separating events that can be distinguished by a plurality of parameters. It is thus possible to diagnose the quality of the coil in a larger target range of the coil by performing a multivariate analysis with the determination unit (6).

It is preferable that the diagnostic device (1) for the coil further include the signal processing unit that calculates the derivative voltage by differentiating the response voltage and that calculates the integral voltage by integrating the response voltage. It is also preferable that the index calculation unit (5) calculate the determination index indicating the electrical feature of the coil (30) based on the response voltage, the derivative voltage, and the integral voltage.

There is a known method of determining the quality of the target coil by calculating the determination index indicating the electrical feature of the coil (30) based on the response voltage, the derivative voltage, and the second order derivative voltage. However, since the noise components of a high frequency is acuminated as the number of times the voltage is differentiated is increased, there is a possibility that the accuracy of determining the quality of the coil (30) will decrease. In the configuration, the determination index is calculated based on the response voltage, the derivative voltage, and the integral voltage. The difference between the number of times the voltage is differentiated for each of the three voltages is "two", in the case of using the response voltage, the derivative voltage, and the second order derivative voltage and also in the case of using the response voltage, the derivative voltage, the integral voltage. That is, when the response voltage, the derivative voltage, and the integral voltage are used, the derivative voltage is a second derivative of the integral voltage. It is thus possible to calculate the determination index based on the response voltage, the determination index, and the integral voltage. Since the increase of noise components in conjunction of the increase of the number of times the voltage is differentiated is suppressed in this case, the decrease of the accuracy of the determination index can also be suppressed. As a result, the accuracy of determining the quality of the target coil based on the determination index can be improved. That is, with the configuration, it is possible to perform diagnosis of the quality of the coil (30) at a higher determination accuracy based on the response voltage that is acquired by applying the impulse voltage.

DESCRIPTION OF THE REFERENCE NUMERALS

1: Diagnostic device (diagnostic device for coil)
2: Voltage application unit
3: Response voltage detection unit
4: Signal processing unit
5: Feature amount calculation unit (index calculation unit)
6: Determination unit
30: Coil
35: Linear conductor (conductor)
tx2: Second zero cross point
v(t): Response voltage
LC: Feature amount (determination index)
RC: Feature amount (determination index)
X: Feature amount (determination index)
2: Voltage application step
3: Response voltage detection step
5: Feature amount calculation step (index calculation step)
6: Determination step

The invention claimed is:

1. A diagnostic device for a target coil, the diagnostic device comprising:
   a voltage application unit configured to apply an impulse voltage to the target coil;
   a response voltage detection unit configured to detect a response voltage from the target coil with respect to the impulse voltage;
   an index calculation unit configured to calculate a determination index indicating an electrical response of the target coil based on the response voltage; and
   a determination unit configured to determine whether there is an abnormality in the target coil to be diagnosed by comparing a predetermined determination index of a reference coil that is normal and the determination index of the target coil based on a circuit constant of the target coil and a circuit constant of the reference coil, wherein
   at least one of a zero cross point at which the response voltage intersects with a predetermined reference voltage, and a peak voltage on a positive side and a negative side of the response voltage is used as the determination index for the target coil.

2. The diagnostic device for a coil according to claim 1, wherein the circuit constant of the target coil includes a product of an inductance of the target coil and an interline capacitance of the target coil and the reference coil, and a product of a resistance of the target coil and the interline capacitance the target coil and the reference coil.

3. The diagnostic device for a coil according to claim 2, wherein the reference voltage is zero volts.

4. The diagnostic device for a coil according to claim 2, wherein the zero cross point is a plurality of points at or after a second zero cross point at which the response voltage intersects with the reference voltage for a second time.

5. The diagnostic device for a coil according to claim 4, wherein
   the zero cross point at the plurality of points includes a reference zero cross point that is set at the zero cross point at or after the second zero cross point and a determination zero cross point that is set at the zero cross point at or after the reference zero cross point, and
   the determination index of the target coil is an amount of time from the reference zero cross point to the determination zero cross point.

6. The diagnostic device for a coil according to claim 5, wherein at least one zero cross point is included as an intermediate zero cross point between the reference zero cross point and the determination zero cross point.

7. The diagnostic device for a coil according to claim 2, wherein the peak voltage is a voltage of the response voltage of or after a second period.

8. The diagnostic device for a coil according to claim 2, wherein an abnormality of the target coil includes poor insulation of the target coil.

9. The diagnostic device for a coil according to claim 8, wherein
   the determination unit determines whether there is an abnormality in the target coil in a manner that:
   the zero cross point is set as the determination index of the target coil, when an abnormality of the target coil is a dead short circuit in which the target coil short circuits at a resistance less than a short circuit threshold that is prescribed; and the peak voltage is set as the determination index of the target coil, when an abnormality of the target coil is a resistance short circuit in which the target coil short circuits at a resistance equal to or more than the short circuit threshold.

10. The diagnostic device for a coil according to claim 2, wherein the determination unit performs a multivariate analysis of at least three types of determination indexes including the circuit constant of the target coil, the circuit constant of the reference coil and the zero cross point, and performs determination based on a distance between a position in a determination coordinate space of the determination index of the reference coil and a position in the determination coordinate space of the determination index of the target coil.

11. The diagnostic device for a coil according to claim 1, wherein the reference voltage is zero volts.

12. The diagnostic device for a coil according to claim 1, wherein the zero cross point is a plurality of points at or after a second zero cross point at which the response voltage intersects with the reference voltage for a second time.

13. The diagnostic device for a coil according to claim 12, wherein
the zero cross point at the plurality of points includes a reference zero cross point that is set at the zero cross point at or after the second zero cross point and a determination zero cross point that is set at the zero cross point at or after the reference zero cross point, and
the determination index of the target coil is an amount of time from the reference zero cross point to the determination zero cross point.

14. The diagnostic device for a coil according to claim 13, wherein at least one zero cross point is included as an intermediate zero cross point between the reference zero cross point and the determination zero cross point.

15. The diagnostic device for a coil according to claim 1, wherein the peak voltage is a voltage of the response voltage of or after a second period.

16. The diagnostic device for a coil according to claim 1, wherein an abnormality of the target coil includes poor insulation of the target coil.

17. The diagnostic device for a coil according to claim 16, wherein
the determination unit determines whether there is an abnormality in the target coil in a manner that:
the zero cross point is set as the determination index of the target coil, when an abnormality of the target coil is a dead short circuit in which the target coil short circuits at a resistance less than a short circuit threshold that is prescribed; and
the peak voltage is set as the determination index of the target coil, when an abnormality of the target coil is a resistance short circuit in which the target coil short circuits at a resistance equal to or more than the short circuit threshold.

18. The diagnostic device for a coil according to claim 1, wherein the determination unit performs a multivariate analysis of at least three types of determination indexes including the circuit constant of the target coil, the circuit constant of the reference coil and the zero cross point, and performs determination based on a distance between a position in a determination coordinate space of the determination index of the reference coil and a position in the determination coordinate space of the determination index of the target coil.

19. The diagnostic device for a coil according to claim 1, wherein
the diagnostic device further comprises a signal processing unit that calculates a derivative voltage by differentiating the response voltage and that calculates an integral voltage by integrating the response voltage, and
the index calculation unit calculates the determination index of the target coil indicating the electrical response of the target coil based on the response voltage, the derivative voltage, and the integral voltage.

20. A diagnostic method for a target coil, the diagnostic method comprising:
a voltage applying step of applying an impulse voltage to the target coil;
a response voltage detection step of detecting a response voltage from the target coil with respect to the impulse voltage;
an index calculation step of calculating a determination index indicating an electrical response of the target coil based on the response voltage; and
a determination step of determining whether there is an abnormality in the target coil to be diagnosed by comparing a predetermined determination index of a reference coil that is a coil that is normal and the determination index of the target coil, and a circuit constant of the target coil and a circuit constant of the reference coil, wherein
at least one of a zero cross point at which the response voltage intersects with a predetermined reference voltage, and a peak voltage on a positive side and a negative side of the response voltage is used as the determination index of the target coil.

* * * * *